US012682201B2

(12) United States Patent
Roessner et al.

(10) Patent No.: US 12,682,201 B2
(45) Date of Patent: Jul. 14, 2026

(54) SMART CARD INLAY ELEMENT

(71) Applicant: AdvanIDe Holdings Pte. Ltd., Singapore (SG)

(72) Inventors: Holger Roessner, Singapore (SG); Joe Lo, Singapore (SG); Grahame John Lucas, Singapore (SG)

(73) Assignee: ADVANIDE HOLDINGS PTE. LTD., Singapore (SG)

( * ) Notice: Subject to any disclaimer, the term of this patent is extended or adjusted under 35 U.S.C. 154(b) by 0 days.

(21) Appl. No.: 19/087,372

(22) Filed: Mar. 21, 2025

(65) Prior Publication Data

US 2025/0299011 A1 Sep. 25, 2025

Related U.S. Application Data

(63) Continuation of application No. 19/087,189, filed on Mar. 21, 2025, now abandoned.

(60) Provisional application No. 63/568,973, filed on Mar. 22, 2024.

(51) Int. Cl.
| | |
|---|---|
| *G06K 19/077* | (2006.01) |
| *H01Q 1/22* | (2006.01) |
| *H01Q 7/00* | (2006.01) |
| *H10K 59/131* | (2023.01) |

(52) U.S. Cl.
CPC . *G06K 19/07722* (2013.01); *G06K 19/07773* (2013.01); *H01Q 1/2216* (2013.01); *H01Q 7/00* (2013.01); *H10K 59/131* (2023.02)

(58) Field of Classification Search
CPC ....... G06K 19/07722; G06K 19/07773; H10K 59/131

USPC .......................................................... 235/492
See application file for complete search history.

(56) References Cited

U.S. PATENT DOCUMENTS

| | | | |
|---|---|---|---|
| 2008/0308641 A1* | 12/2008 | Finn | H04B 5/77 235/492 |
| 2015/0008408 A1 | 1/2015 | Lee et al. | |
| 2017/0352503 A1 | 12/2017 | Sanford | |
| 2022/0230037 A1* | 7/2022 | Roessner | G07F 7/0833 |

(Continued)

FOREIGN PATENT DOCUMENTS

| | | |
|---|---|---|
| CN | 109769322 A | 5/2019 |
| KR | 20100052982 A | 5/2010 |

OTHER PUBLICATIONS

Roessner, H. et al., "Smart Card Inlay Element," U.S. Appl. No. 63/568,973, filed Mar. 22, 2024, 63 pages.

*Primary Examiner* — Allyson N Trail
(74) *Attorney, Agent, or Firm* — McCoy Russell LLP

(57) ABSTRACT

An Inlay element for a smart card, comprising an antenna layer, a first antenna coil being arranged on a top surface the antenna layer, a second antenna coil being arranged on the top surface of the antenna layer, a first compensation layer being arranged on the top surface of the antenna layer, an OLED module being arranged at least partially within the antenna layer and within the first compensation layer, a first overlay layer being arranged below a bottom surface of the antenna layer, and a transmissive second overlay layer being arranged above a top surface of the first compensation layer, wherein the first antenna coil is galvanically decoupled from the second antenna coil, and wherein the first antenna coil and the OLED module are connected in series with a rectifier assembly.

20 Claims, 18 Drawing Sheets

(56)　　　　　　References Cited

U.S. PATENT DOCUMENTS

2023/0214627 A1　　7/2023　Coleman
2024/0070433 A1*　2/2024　Alexandre ....... G06K 19/07779

* cited by examiner

SMART CARD INLAY ELEMENT

CROSS REFERENCE TO RELATED APPLICATIONS

The present application is a continuation of U.S. Non-Provisional application Ser. No. 19/087,189, entitled "SMART CARD INLAY ELEMENT", and filed on Mar. 21, 2025. The present application further claims priority to U.S. Provisional Application No. 63/568,973, entitled "SMART CARD INLAY ELEMENT", filed on Mar. 22, 2024. The entire contents of each of the above-listed applications are hereby incorporated by reference for all purposes.

TECHNICAL FIELD

The present application relates generally to a smart card inlay element, and more specifically to a technology for enhancing the functionality and security of smart cards.

BACKGROUND ART

US20230214627A1 discloses a transaction card with an antenna inlay layer, a loop antenna, and a light-emitting element positioned between two print layers, one of which has a transparent portion. Wireless power receiver circuitry induces a voltage across the light-emitting element, enabling illumination through the transparent section.

US2023214627A1 discloses an illuminating transaction card with an antenna inlay layer and a light-emitting element, such as an LED, OLED panel, or printed microLEDs. A loop antenna receives wireless power to activate the light-emitting element, which is positioned between the antenna inlay layer and a print layer with a transparent section for light transmission.

US2015008408A1 discloses an organic light-emitting diode (OLED) and an organic light-emitting apparatus. An organic light-emitting diode includes multiple layers, including a hole injection layer, hole transport layer, optical compensation layer, emission layer, electron transport layer, and electron injection layer.

CN109769322A discloses a planar high-frequency OLED driving circuit based on a low voltage stress resonant inverter. A planar high-frequency OLED driving circuit utilizes a low-voltage stress resonant inverter to address the large volume of conventional OLED drivers.

KR20100052982A discloses a lighting apparatus designed to replace fluorescent and incandescent lamps with LED or OLED-based lighting units. A lighting device is designed to be compatible with the power supply of an existing incandescent lamp without modification.

US2017352503A1 discloses an electronic device with OLED display, used on wearable electronic devices such as smartwatches or media players. The electronic device includes a housing with a protrusion positioned between a display cover layer and display components.

These approaches present limitations.

Problem Statement

This application addresses the problem of improving the functionality and performance of smart cards by providing an inlay element with enhanced features.

The application provides solutions for incorporating at least two antenna coils, an LED module, in particular an OLED module, and a rectifier assembly. A contactless chip module and/or a capacitor module within the inlay element.

The application also addresses the problem of manufacturing an inlay element for smart cards efficiently by providing a method that involves collating and laminating various layers while applying heat and/or pressure. Additionally, the application addresses the problem of manufacturing chip card sheets and chip cards by providing methods for incorporating chip modules and creating chip card areas with openings for the modules.

This problem is solved by the subject matter of the independent claims. Further solutions are given by the subject matter of the dependent claims.

The subject matter of the application introduces a combination of features that improve both functionality and durability compared to prior art documents. Wireless power reception through a dual-antenna coil system removes the need for physical electrical connectors, reducing potential points of failure. OLED placement improves energy efficiency, ensuring stable performance under real-world usage conditions. Compensation layers contribute to better structural uniformity, improving manufacturing consistency and product longevity. The structured manufacturing process further ensures scalability and cost-effectiveness, making it viable for mass production while maintaining product reliability.

Different from US2023214627A1, the subject matter of the application provides a smart card with a light-emitting element powered wirelessly with a dual antenna system with galvanic decoupling, improving energy transfer efficiency and minimizing interference. Additionally, the design of the application integrates first and second compensation layers to maintain uniform thickness and structural stability. It also has a first overlay layer that is arranged below a bottom surface of the antenna layer. There is also a transmissive second overlay layer being arranged above a top surface of the first compensation layer. It may also introduce a third coil, which is galvanically coupled to the second antenna coil, further enhancing performance. Unlike the prior art, the subject matter of the application may provide an ICT element that ensures stable power delivery to the OLED module. The OLED module may be positioned within the antenna layer and within the first compensation layer, improving energy harvesting and durability. The structured manufacturing process in the subject matter of the application supports precise alignment and efficient integration of components, a feature not discussed in the prior document.

Different from US2017352503A1, the subject matter of the application integrates OLEDs into a smart card inlay. The subject matter of the application provides a smart card that maintains a thin profile while incorporating an OLED module. The subject matter of the application provides an inlay element for a smart card that may incorporate a second compensation layer positioned between the first compensation layer and the second overlay layer. This added layer contributes to increased stability and safeguards the OLED module, supporting the durability and longevity of the smart card and helps to balance height variations among the components within the inlay element. The inclusion of compensation layers ensures uniform thickness and structural integrity, preventing manufacturing inconsistencies. The subject matter of the applications provides an OLED module arranged at least partially within the antenna layer and within the first compensation layer. The integration of a contactless chip module enables secure NFC-based transactions, and the structured lamination process allows for efficient production of smart card inlays. There is also a transmissive second overlay layer being arranged above a top surface of the first compensation layer that protects the internal components while allowing for visual display.

Embodiments of the application are associated with various advantages and/or technical effects.

There is disclosed an inlay element for a smart card, comprising:

an antenna layer;

a first antenna coil being arranged on a top surface the antenna layer;

a second antenna coil being arranged on the top surface of the antenna layer;

a first compensation layer being arranged on the top surface of the antenna layer;

an OLED module being arranged at least partially within the antenna layer and within the first compensation layer;

a first overlay layer being arranged below a bottom surface of the antenna layer, a transmissive second overlay layer being arranged above a top surface of the first compensation layer, wherein the first antenna coil is galvanically decoupled from the second antenna coil, and wherein the first antenna coil and the OLED module are connected in series with a rectifier assembly.

The smart card incorporates a light-emitting element that is activated wirelessly through an oscillating magnetic field, generated by a smart card reader device. This eliminates the necessity for internal power sources or physical connections, enabling a seamless, illuminated user interaction without compromising the smart card's slim profile.

OLED stands for Organic Light Emitting Diode. OLED modules are made of organic compounds that emit light when an electric current is applied. Some embodiments of the application enable each pixel of the OLED to produce its own light, eliminating the need for a backlight. As a result, the OLED achieves deep blacks, higher contrast ratios, and wider viewing angles compared to LCDs. Additionally, OLED modules can be made thinner and more flexible, allowing for innovative device designs. The size of the OLED module may vary its placement and may partially place it within the antenna layer and within the first compensation layer. "Partially" means it may be positioned in such a way that only a portion of it is within the antenna layer, while some portion may be within the first compensation layer. This suggests that the OLED module's placement is not strictly confined in one layer and may overlap between two or more layers such as the first compensation layer, second compensation layer, antenna layer, and second overlay layer. The OLED module may be positioned in a way that only part of it is inside the antenna layer, while another part is inside the first compensation layer. This means the OLED module is not limited to just one layer. Instead, it can extend across multiple layers, such as the first compensation layer, the second compensation layer, the antenna layer, and the second overlay layer. The explanation of "partially" extends also to other uses of the term in this application.

There is disclosed a first overlay layer arranged below a bottom surface wherein a surface may be the outer boundary of a material layer constituting or resembling such a boundary of the antenna layer, wherein a transmissive second overlay layer may be arranged above a top surface of the first compensation layer.

In the context of this application, the properties of light transmission through materials may be categorized as follows: Transparent materials are those that allow light to pass through with minimal scattering, rendering objects on the side distinctly visible with clear details and accurate colors, akin to ordinary window glass. Translucent materials, in contrast, permit the passage of light but disperse it in the process, resulting in a scenario where light is transmitted but the clarity of object visibility is significantly reduced, manifesting as a blurred or softened view, similar to frosted glass. The overarching term 'transmissive' is employed to refer to both these categories encompassing any material that allows the passage of light, irrespective of the degree of clarity or distortion introduced during its transmission.

The first antenna coil may be galvanically decoupled meaning that there is no direct electrical connection between the two coils, wherein a coil is a reactor consisting of a spiral of insulated wire that introduces inductance into a circuit, from the second antenna coil, and wherein the first antenna coil and the LED module are connected in with a rectifier assembly. The first antenna coil may be configured to provide electrical energy for the LED module via inductive coupling of the first antenna coil with an external reader.

"Top" and "bottom" may be meant in the sense of the y-direction in the Figures.

In a development, the embodiment may further comprises an inlay, wherein an inlay is the material placed within a different material in the form of a decoration, element according to any of the preceding items, wherein there may be a first transparent plastic top layer, possibly made from transparent PVC, provided on the bottom side of the first plastic cover layer and/or there may be a second transparent plastic top layer, possibly made from transparent PVC, provided on the top side of the second plastic cover layer. This may protect the graphical design on the first plastic layer and/or the second transparent plastic layer.

The smart card's design features at least one layer with transparent or translucent sections, designed to permit the passage of light from the internal light-emitting elements. This characteristic allows for a wide range of optical effects, enabling issuers to customize the visual appearance of the smart card to suit specific requirements.

Despite its illumination functionality, the smart card adheres to the size and thickness specifications set forth by the technical standards for smart cards. This ensures universal compatibility with existing payment terminals and smart card readers.

The applications supports various forms of light-emitting elements, including, but not limited to, single LEDs, arrays of LEDs, OLED panels, and printed LED dispersions. This flexibility allows for tailored illumination effects, including adjustable brightness, color schemes, and dynamic patterns. MicroLEDs provide arrays of microscopic LEDs forming the individual pixel elements. MicroLED is based on inorganic materials, specifically gallium nitride (GaN), which offers high brightness, improved energy efficiency, and longer lifespans. Each pixel in a microLED display is a tiny LED itself, capable of emitting its own light, which eliminates the need for a backlight and allows for true blacks and an infinite contrast ratio.

One of the advantages of microLED technology is its potential for higher brightness levels and greater durability, making it particularly suitable for a wide range of applications, including smartphones, televisions, wearables, and large-scale displays like those used for outdoor advertising. Additionally, microLED displays can offer significant power savings, especially beneficial for portable electronics where battery life is crucial.

Despite its advantages, the manufacturing process for microLED displays is complex and costly, primarily due to the challenges in miniaturizing LEDs and accurately placing them on the display substrate. However, ongoing research and development efforts aim to overcome these obstacles, making microLED technology a promising candidate for the next generation of high-definition displays.

Utilizing an inductive coil mechanism, the smart card receives energy wirelessly, facilitating the powering of the light-emitting element. This method of energy transfer is not only efficient but also reduces the need for maintenance, such as battery replacement, thereby enhancing the smart card's longevity and user convenience.

The illumination feature doubles as a security measure, providing visual feedback during transactions. This can serve to indicate smart card activation or validate transaction processes, for example initiated by an external reader device by switching off the electric-magnetic reader device field for a short time and then switching it on again, offering an additional layer of security to both cardholders and merchants.

The integration of light-emitting elements in a two-dimensional form factor within the smart card's structure contributes to its durability and reliability. This design approach protects the illumination components from physical damage, ensuring the smart card's functional longevity.

The smart card's technology permits the formation of specific light-emitting patterns or designs, such as logos or text, through printed microLEDs or strategic diode placement. This customization capability enhances the smart card's visual appearance and visibility.

The smart card's ability to illuminate upon proximity to a reader device or in response to a wireless power signal introduces an interactive element to the user experience. This feature not only engages the cardholder during transactions but also serves as a visual confirmation of the smart card's operational status and whether or not the external smart card reader device is working as intended.

The inlay element for a smart card can include a second compensation layer between the first compensation layer and the second overlay layer. This additional layer provides improved stability and protection for the OLED module, enhancing the overall durability and lifespan of the smart card, and it can serve to compensate height differences between the components of the inlay element of the smart card.

This assembly provides the advantage of improved opacity, ensuring that the OLED element within the inlay element is visible from the outside, also allowing for efficient and effective conduction of electrical signals between the antenna coils and the OLED module.

Operation of the inlay element is provided by the rectifier assembly converting alternating current to direct current. The assembly allows for triplicated functionality, providing redundancy and reliability in the connection between the first antenna coil, the second antenna coil, and the OLED module.

The assembly facilitates easy integration of the inlay element into a smart card, as it includes a first overlay layer and a transmissive second overlay layer that protect the internal components while allowing for visual display.

In a development, the inlay element and the chip card further comprises a second compensation layer being arranged between the first compensation layer and the second overlay layer. This additional layer provides improved stability and protection for the OLED module, enhancing the overall durability and lifespan of the smart card. Differences in thickness can be equalized by using such a second compensation layer.

The inlay element further comprises a third antenna coil that is galvanically coupled with the second antenna coil. This coupling allows for efficient wireless communication and transmission of data, ensuring reliable and fast performance of the smart card, especially when a dual-interface chip module is used. That third antenna coil can be arranged on the top surface of the antenna layer.

The inlay element also includes a contactless chip module within the antenna layer and the first compensation layer. This integration of the chip module enhances the functionality of the smart card, enabling secure and convenient contactless transactions.

The inlay element can also include a capacitor module within the antenna layer and the first compensation layer, with contact pads of the capacitor module connected to end sections of the second antenna coil. This configuration enhances the power efficiency of the smart card, providing an improvised matching of the smartcard to an external reader device. The capacitor module is at least partially arranged within the antenna layer and within the first compensation layer.

In a development, the inlay element and the chip card further comprises a contactless chip module being arranged at least partially within the antenna layer and within the first compensation layer. That is a technically simple design that is used for access control and other contactless applications.

The inclusion of the rectifier assembly in the OLED module allows for efficient conversion of alternating current (AC) to direct current (DC), ensuring optimal power supply to the various components of the system.

The presence of an ICT element comprising a first connection element and a second connection element enables seamless and reliable contact between the inlay element and the chip card and the OLED panel, ensuring stable and uninterrupted energy transfer.

In a development, the OLED module further comprises the rectifier assembly. That makes production of a working chip card easier because quality control of the rectifier assembly can happen together with quality control of the other components of the OLED module.

The arrangement of the OLED module within an enclosed area of the first antenna coil, with specified distances to edges of the inlay element, resulting in improved energy harvesting. It further provides effective protection against physical damage, ensuring the longevity and durability of the inlay element and the chip card The inclusion of an OLED module with a specific color and size allows for customization and flexibility in the visual display of information, catering to different user preferences and requirements, for example when using the OLED together with other optical features that come with tampering protection or other security features of the smart card.

The presence of an OLED module enhances the visual appearance of the smart card, improving user experience. For example, it is possible to provide oscillating effects by designing the OLED panel into an oscillator circuit, using the inductance of the first antenna coil or another inductance, the rectifying capacitor or another capacitance, and optionally a switching element such as a transistor.

In a development, the inlay element and the chip card further comprises an ICT element comprising a first connection element and a second connection element for contacting the OLED panel.

The inclusion of end sections of the second antenna coil being connected with antenna pads of the contactless chip module ensures efficient and reliable communication between the inlay element and the chip card and external devices, such as contactless payment terminals or access control systems.

The presence of the rectifier assembly allows for seamless integration with existing power supply systems, eliminating the need for additional power sources and simplifying the overall setup.

The inclusion of an ICT element comprising a first connection element and a second connection element enables easy manufacturing of the ICT element and of the inlay element, facilitating maintenance and reducing downtime of the manufacturing equipment.

In a development, the inlay element and the chip card further comprise an OLED module being arranged within an enclosed area of the first antenna coil, the area having specified distances to edges of the inlay element.

The inclusion of an OLED module with a specific color and size allows for clear and easily distinguishable visual indicators or notifications, enhancing user understanding and interaction with the inlay element and the chip card The presence of an OLED module enhances the overall user experience by providing dynamic and interactive visual feedback, improving user engagement and satisfaction. Therefore, in a development, the inlay element and the chip card further comprise an OLED module comprising a OLED panel with a specific color and a specific size.

The inclusion of end sections of the second antenna coil being connected with antenna pads of the contactless chip module ensures reliable and secure communication between the inlay element and the chip card and external devices, preventing unauthorized access or tampering.

The presence of the rectifier assembly allows for efficient power management, optimizing energy consumption and extending the time when the inlay element and the chip card emits light after being removed from the influence of an external reader. Although an LED, and especially an OLED, can directly convert alternating current into light energy, the application provides a rectifier assembly because this can enhance the life span of the OLED. In an embodiment, the LED can be included into the rectifier assembly, that can save space and costs.

The inclusion of an ICT element comprising a first connection element and a second connection element enables easy integration with existing electronic systems, such as other inlay element components, facilitating manufacture, compatibility and interoperability.

A smart card according to the application comprises an inlay element with a first plastic cover layer provided on the first overlay layer and/or a second plastic cover layer provided on the second overlay layer. The smart card comprising an inlay element with a first plastic cover layer and/or a second plastic cover layer provides enhanced protection and durability to the underlying layers, ensuring the longevity of the smart card.

The inclusion of a first transparent plastic top layer and/or a second transparent plastic top layer on the first plastic cover layer and/or the second plastic cover layer allows for clear visibility of the underlying layers.

The inclusion of an insulating substrate in the smart card's inlay element provides electrical insulation, preventing any unwanted electrical interference or short circuits. The presence of first and second connection pads on the top surface of the insulating substrate allows for easy and secure connection of wires, ensuring reliable electrical connections within the smart card.

The rectifier assembly, which includes conductive traces on both the upper and lower surfaces of the insulating substrate, ensures efficient and reliable electrical connections between the first connection pad, second connection pad, first connection element, and second connection element.

The use of a smoothing capacitor C2 in the rectifier assembly enhances the stability of the electrical current, reducing any potential fluctuations or noise that may affect the performance of the smart card or the OLED, or both.

In a development, the inlay element and the chip card further comprises a rectifier assembly comprising a smoothing capacitor C2 that connects the first connection pad and the second connection pad.

The inclusion of conductive traces and landing pads in the rectifier assembly allows for easy integration of a conductive element R1 and a rectifier diode D1, ensuring secure and efficient electrical connections within the smart card.

The electrical connection of the first connection pad, second connection pad, first connection element, and second connection element through the conductive element R1 and rectifier diode D1 ensures proper functioning and reliable performance of the smart card.

The inclusion of a rectifier assembly in the smart card's inlay element provides the necessary circuitry to convert alternating current (AC) to direct current (DC) which is required to operate the OLED.

The rectifier diodes D1, D2, D3, and D4 provide efficient rectification of the electrical current, ensuring smooth and reliable operation of the inlay element and the chip card The method of the application allows for the efficient assembly of an antenna layer plastic sheet with multiple antenna layers and cut-out sections for various modules, such as OLED modules, COB contactless chip modules, and COB capacitor modules.

The use of an adhesive tape layer at the bottom surface of the antenna layer plastic sheet provides secure attachment and protection for the modules placed in the cut-out sections, ensuring their stability during the manufacture of the inlay element.

The connection of COB contactless chip modules and/or COB capacitor modules with the respective first antenna coils, and the connection of OLED modules with the respective second antenna coils, allows later for effective communication and power transfer between the modules and the antenna layer plastic sheet.

The addition of a first compensation layer plastic sheet on the top surface of the antenna layer plastic sheet provides further protection and support for the OLED modules, COB contactless chip modules, and COB capacitor modules, ensuring their proper fit and alignment.

The collating and laminating process, along with the application of heat and/or pressure, ensures a strong and durable bond between the antenna layer plastic sheet, the first compensation layer plastic sheet, the first overlay layer plastic sheet, and the second overlay layer plastic sheet, resulting in a robust and reliable inlay elements sheet.

The replacement of certain steps with the provision of a second compensation overlay layer plastic sheet allows for additional protection and support for the OLED modules, ensuring their proper fit and alignment.

The collating and laminating process, along with the application of heat and/or pressure, ensures a strong and durable bond between all the layers, including the antenna layer plastic sheet, the first compensation layer plastic sheet, the second compensation overlay layer plastic sheet, the first overlay layer plastic sheet, and the second overlay layer plastic sheet, resulting in a robust and reliable inlay elements sheet.

In further embodiments of the application, there is adhesive provided between the upper second overlay layer sheet and the first compensation layer sheet and/or between the upper second overlay layer sheet and between the second compensation layer sheet and/or between the antenna layer sheet and the first compensation layer sheet. This allows for laminating the sheets together at lower temperatures, resulting in a better yield of the inlay elements sheet and a longer life span of the OLED panels which are embedded therein.

A method of manufacturing an inlay elements sheet allows for making a multitude of inlay elements at one time, for later making a multitude of chip cards at one time, wherein the thermal compression between the wire and the OLED ICT only where the wire touches the OLED module, and the thermal compression between the respective end sections of the first antenna coil and a first connection pad and the second connection pad of the OLED module is done without touching an OLED panel of the OLED module.

The thermal compression between the wire and the OLED ICT only where the wire touches the OLED module ensures efficient and precise connection without causing any damage to the OLED panel.

The thermal compression between the respective end sections of the first antenna coil and the first and second connection pads of the OLED module allows for secure and reliable electrical connection, ensuring proper functioning of the OLED module.

The method of manufacturing a chip card sheet allows for the efficient production of smart cards by providing an inlay elements sheet, which simplifies the manufacturing process.

The use of a transparent second plastic top layer sheet on the top surface of the second plastic cover layer enhances the visual appeal of the chip card sheet, making it more attractive to users.

The combination of the inlay elements sheet and the transparent second plastic top layer sheet ensures the durability and longevity of the chip card sheet, simplifies the production process by manufacturing a chip card sheet, eliminating the need for additional steps or materials. The provision of a first plastic top layer sheet on the bottom surface of the first plastic cover layer sheet enhances the structural integrity of the chip card sheet, making it more resistant to wear and tear. Further, the combination of the first plastic top layer sheet and the first plastic cover layer sheet provides a protective barrier for the chip card sheet, preventing damage to the underlying components.

The method of manufacturing a chip card sheet of the application allows for the customization of the sheet by providing at least one first chip module opening in the second plastic cover layer sheet and in the first plastic top layer sheet, enabling the incorporation of specific chip modules.

The provision of the first chip module opening in both the second plastic cover layer sheet and the first plastic top layer sheet ensures a secure fit for the chip module, preventing any movement or displacement during manufacturing. The use of the second plastic cover layer sheet and the first plastic top layer sheet in combination with the first chip module opening provides a protective enclosure for the chip module, safeguarding it from external factors such as moisture or physical damage.

The method of manufacturing a chip card also allows for the efficient production of chip cards by providing a chip card sheet, thereby streamlining the manufacturing process. The placement of a dual-interface chip module into the first chip module opening and/or the second chip module opening ensures the compatibility of the chip card with various contactless card readers and systems. The cutting out of a chip card from the area of the chip card sheet that comprises the dual-interface chip module allows for the precise and accurate production of chip cards, minimizing wastage and maximizing efficiency.

The method of manufacturing a chip card according to the application allows for the efficient production of chip cards by providing a chip card sheet that can be easily cut into individual chip cards. This reduces the time and effort required for manufacturing each chip card individually. The method includes the provision of a first chip module opening in the second plastic cover layer and the first plastic top layer, as well as a second chip module opening in the first compensation layer and the second overlay layer. This allows for the easy placement of a dual-interface chip module into either opening, providing flexibility in the type of chip module used in the chip card. The dual-interface chip module used in the method comprises a chip module antenna, a chip module PCB with ISO contact pads, a dual-interface chip, and a plastic chip cover material. This ensures that the chip card is equipped with a high-quality chip module that can support both contact and contactless communication, enhancing the functionality and versatility of the chip card.

The use of an upper lamination plate and a lower lamination plate in the lamination step allows for a more efficient and effective lamination process. The lamination plates ensure proper adhesion and bonding of the various layers of the chip card, resulting in a strong and durable final product. The upper and lower lamination plates also provide a consistent and uniform pressure during the lamination step, ensuring that the layers of the chip card are evenly compressed and bonded together. This helps to prevent any air bubbles or unevenness in the final chip card, improving its overall quality and appearance. The use of the upper and lower lamination plates also allows for precise control over the lamination process, ensuring that the layers are properly aligned and positioned. This helps to prevent any misalignment or displacement of the layers, which could negatively impact the functionality and reliability of the chip card.

According to the application, a smart card can be a credit card-sized card with embedded integrated circuits that can store, process, and communicate information.

A surface is often but not necessarily always understood as the outer boundary of a material layer constituting or resembling such a boundary.

The first antenna coil and the OLED module are connected in series, wherein a series is connection of components in such a manner that an electrical current flows first through one and then through the other component.

Contact pads are small, conductive surface areas on a printed circuit board or on an integrated circuit. They are often made of gold, copper, or aluminum and measure mere micrometres wide.

An anode or a cathode are electrodes through which electrical current flows into or from a polarized electrical device Heat is, in the sense of warmth, heat energy, hotness, or high temperature, a form of energy that is transferred by a difference in temperature. It can stand for the presence of heat and for the sensation caused by heat energy. Pressure, in the sense of press, pressure level, force per unit area, or pressing, means and/or designates the force applied to a unit area of surface, a force that compels, or the act of pressing or the exertion of pressure The application provides a thermal compression between the wire and the OLED ICT only where the wire touches the OLED module, and the thermal compression between the respective end sections of the first antenna coil and a first connection pad and the second connection of the OLED module is done without touching an OLED panel of the OLED module.

Thermal compression bonding is a manufacturing technique to establish a reliable connection between the end of a wire and a metal contact pad. This method involves the simultaneous application of heat and pressure to facilitate the bonding process. The heat softens the wire and the contact pad, enhancing their malleability and enabling atomic diffusion between the two materials. This diffusion process results in a strong metallurgical bond characterized by its high durability and low electrical resistance, which is critical for the performance of electronic devices.

The application of pressure during thermal compression bonding ensures intimate contact between the wire and the contact pad, promoting the intermixing of atoms and the formation of a dense, void-free bond. The duration of heat and pressure application is precisely controlled to optimize the bonding quality while preventing damage to the materials and surrounding components. This precise control over the bonding parameters makes thermal compression bonding particularly suitable for delicate and high-density applications, such as semiconductor chip packaging, where precision and reliability are paramount.

Thermal compression forms bonds at relatively lower temperatures, thus minimizing the risk of thermal damage. The technique's ability to create low-resistance electrical connections makes it possible to provide the subject matter of the application, for the assembly of electronic components where performance and longevity are critical.

Any one of the presently described embodiments can be advantageously combined with any other one.

It is suggested to combine described embodiments, or combinations thereof, with one or more of the following techniques or technologies or concepts or ideas or paradigms or states or the like.

BRIEF DESCRIPTION OF DRAWINGS

The present disclosure is illustrated by way of example and not limited in the accompanying figures in which like reference numerals indicate similar elements. Embodiments of the application will now be described with reference to the attached drawings.

DETAILED DESCRIPTION

Figure 1:
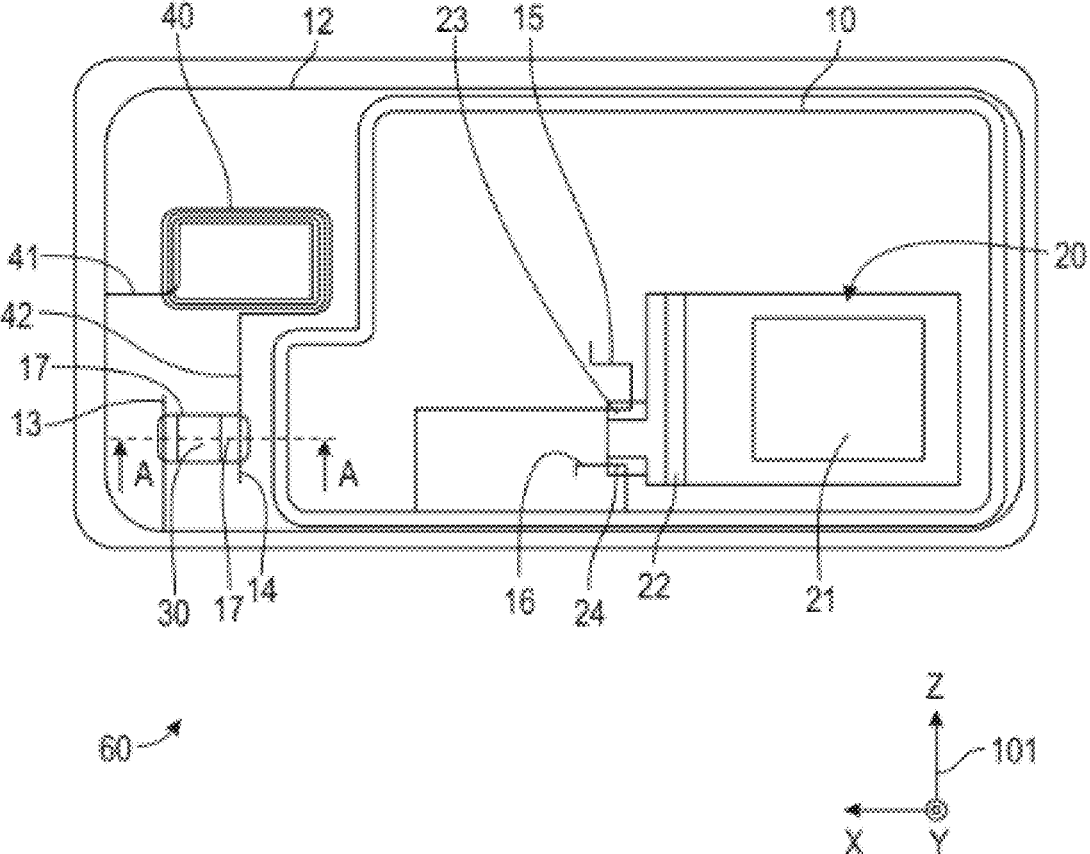
FIG. 1 shows a top view of a dual-interface chipcard according to an embodiment of the application.

FIG. 1 shows a top view of a dual-interface chipcard according to an embodiment of the application.

In embodiment 1, an inlay element 60 for a smart card 100 that comprises an antenna layer 54. This antenna layer 54 hosts a first antenna coil 10 and a second antenna coil 12 on its top surface 66, alongside a first compensation layer 53. Within the antenna layer 54 and the first compensation layer 53, an OLED module 20 is embedded. Below the antenna layer 54 bottom surface 65, a first overlay layer 51 is positioned, and a transmissive second overlay layer 50 is located above the top surface 66 of the first compensation layer 53. The term "transmissive" refers to materials that permit light passage, which can be transparent or translucent, allowing for clear or blurred visibility, respectively.

The first antenna coil 10 is galvanically isolated from the second antenna coil 12, indicating no direct electrical connection between them. This setup, including the series connection of the first antenna coil 10 with the OLED module 20 via a rectifier assembly 27 (not shown here), enables the OLED module 20 to receive power through inductive coupling with an external reader. Orientation is specified with respect to the y-axis as illustrated in the figures.

A second compensation layer 52 is inserted between the first compensation layer 53 and the second overlay layer 50 to address potential height differences between the OLED module 20, a capacitor module 30, and/or a contactless chip module 11.

A third antenna coil 40, electrically coupled with the second antenna coil 12 and placed on the top surface 66 of the antenna layer 54, suggests a dual interface card capability.

The structure also includes a capacitor module 30, partially set within the antenna layer 54 and the first compensation layer 53. The contact pads of this capacitor module 30 are connected in series with the end sections 13, 14 of the second antenna coil 12, with a tuning capacitor mentioned as an optional component.

Lastly, an ICT element 22 links the first antenna coil 10 to the OLED panel 21 of the OLED module 20 and encompasses the rectifier assembly 27. This element is designed to supply electrical energy to the OLED module 20, contributing to the smart card 100's operational efficiency.

Figure 2:
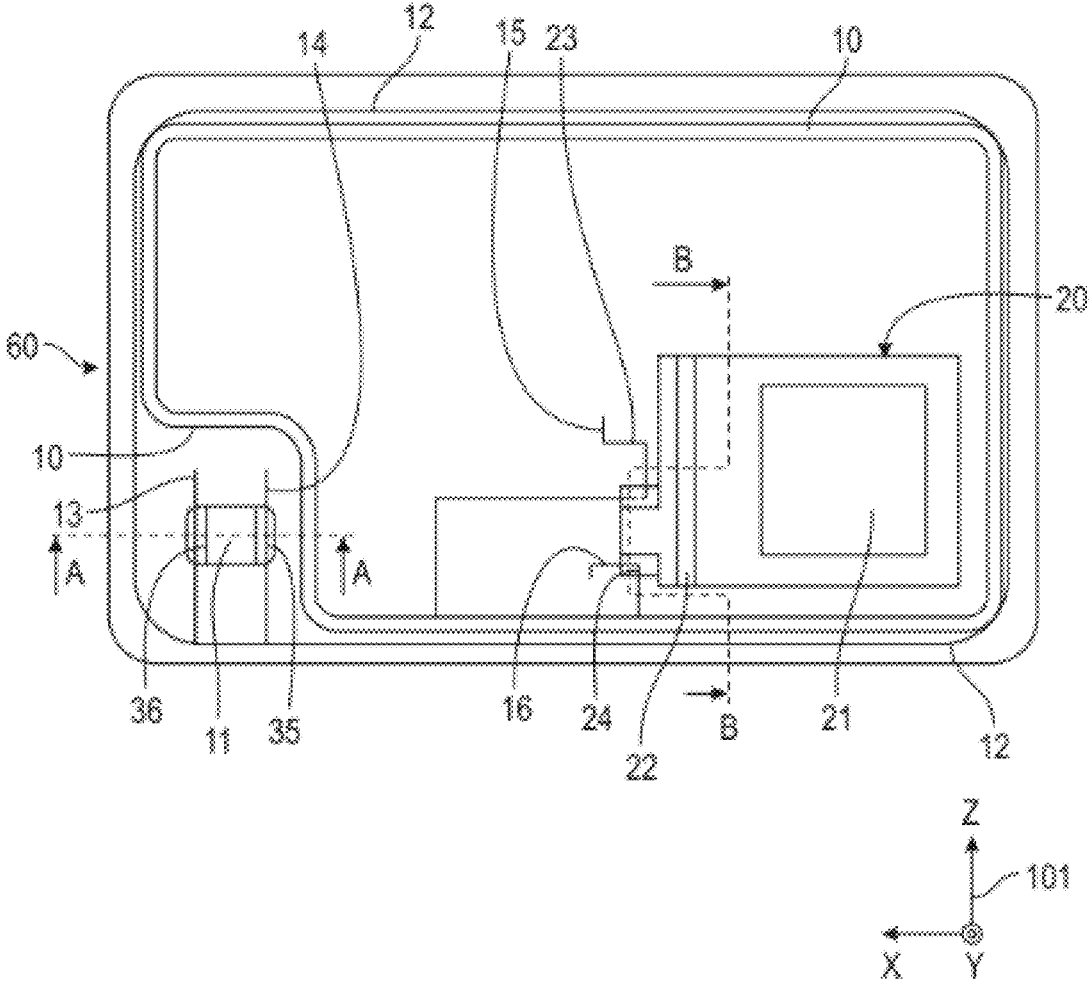
FIG. 2 shows a top view of a contactless chipcard according to a second embodiment of the application.
Figure 3:
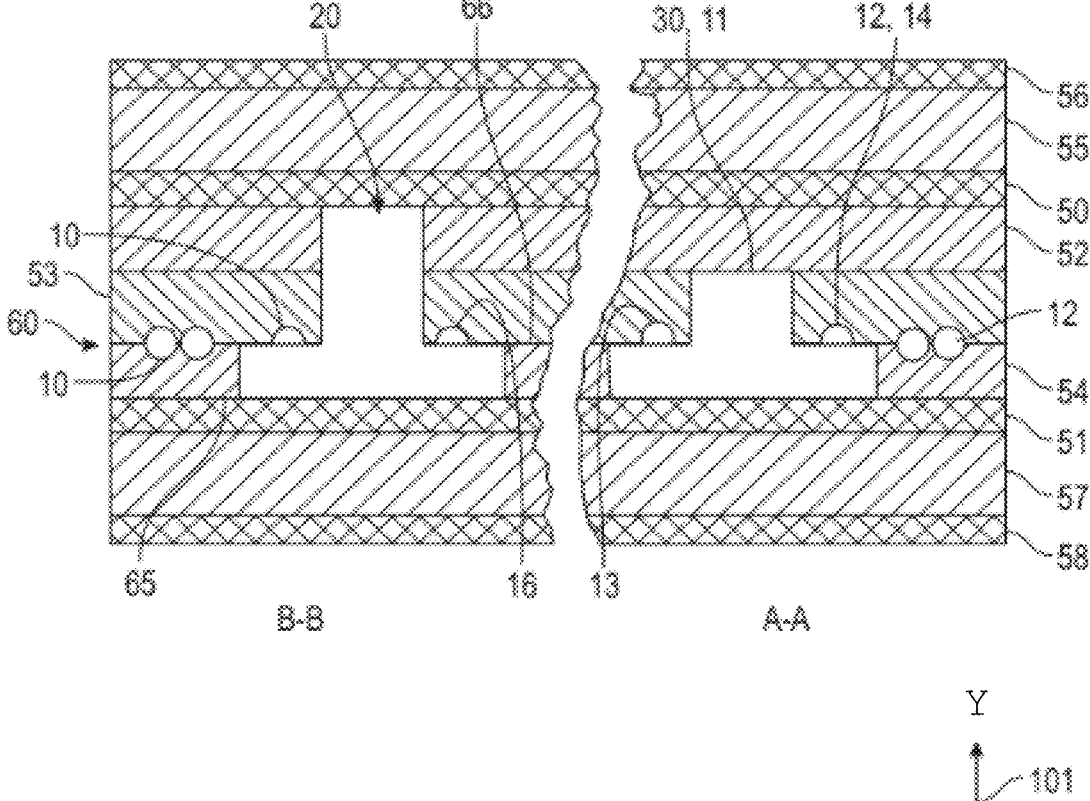
FIG. 3 shows a cross-section through the embodiments shown in FIG. 1 and FIG. 2.

FIG. 2 shows a top view of a contactless chip card according to a second embodiment of the application The second embodiment, as shown in FIGS. 2 and 3, comprises an inlay element 60 suitable for use within a smart card 100. This inlay element includes an antenna layer 54, upon which a first antenna coil 10 and a second antenna coil 12 are arranged on the top surface 66. Additionally, a first compensation layer 53 is positioned on the top surface 66 of the antenna layer 54. The OLED module 20 is located at least partially within both the antenna layer 54 and the first compensation layer 53. On the underside of the antenna layer 54, a first overlay layer 51 is placed beneath the bottom surface 65, and a transmissive second overlay layer 50 is situated above the top surface 66 of the first compensation layer 53.

The first antenna coil 10 is electrically isolated or galvanically decoupled from the second antenna coil 12, meaning there is no direct electrical connection between them. The first antenna coil 10 is connected in series with the OLED module 20 via a rectifier assembly 27. This series connection with the first antenna coil 10 allows for the provision of electrical power to the OLED module 20 through inductive coupling with an external reader, with the orientation of "top" and "bottom" being in line with the y-direction in the figures.

The inlay element 60 also comprises a second compensation layer 52, which lies between the first compensation layer 53 and the second overlay layer 50. The purpose of this second compensation layer is to add thickness to balance out the height differences between the OLED module 20 and other components, such as the capacitor module 30 and/or the contactless chip module 11, as can be seen in FIG. 3.

Moreover, the inlay element 60 includes a contactless chip module 11 which is partially embedded within both the antenna layer 54 and the first compensation layer 53, indicative of a contactless chip card configuration.

The end sections 13, 14 of the second antenna coil 12 are linked to antenna pads 17 of the contactless chip module 11. This connection facilitates the transfer of electrical energy to the contactless chip module 11 via inductive coupling from the second antenna coil 12 when interacting with an external reader.

An ICT element 22 is incorporated into the inlay element 60, which establishes a connection between the first antenna coil 10 and an OLED panel 21 of the OLED module 20. The ICT element 22 includes a rectifier assembly 27 and is tasked with supplying electrical power to the OLED module 20.

FIG. 3 shows a cross-section through the embodiments shown in FIG. 1 and FIG. 2

In the description of embodiment 1 and embodiment 2, not all elements mentioned in the associated claims can be explicitly seen in the FIGS. 1 and 2. However, these elements are implicitly present.

The ICT element, as part of this embodiment, includes a first and a second comb-shaped connection element, designed for contacting the anode and cathode of an OLED panel. Although these comb-shaped connection elements are not visibly depicted in the FIGS. 1 and 2, their presence is implied due to their role in distributing shear forces, with each pole of the OLED panel having one connection element to ensure stability and efficient energy transfer.

Further detailing the ICT element, it comprises an insulating substrate that supports a first and a second connection pad on its top surface. These pads are intended to receive first and second end sections of wires, respectively. Additionally, the first and second connection elements, provided on the upper surface of the insulating substrate, are intended for establishing electrical connections with the anode and cathode of the OLED panel. The inclusion of a rectifier assembly, which is electrically connected between these components, facilitates the connection to the cathode of the OLED panel. This assembly, featuring conductive traces on both the upper and possibly the lower surface of the insulating substrate, although not directly observable in the figures, is part of the ICT element's design.

The manufacturing method of the inlay elements sheet incorporates steps that involve the use of thermal compression to connect COB contactless chip modules or COB capacitor modules with the respective first antenna coils, as well as to connect the OLED modules with the respective second antenna coil. This process, particularly for the connection between the wire and the OLED ICT, ensures that thermal compression is applied only at points of contact, avoiding direct contact with the heat-sensitive OLED panel. The precision in applying thermal compression, especially between the end sections of the first antenna coil and the connection pads of the OLED module, preserves the integrity and functionality of the OLED panel.

Figure 4:
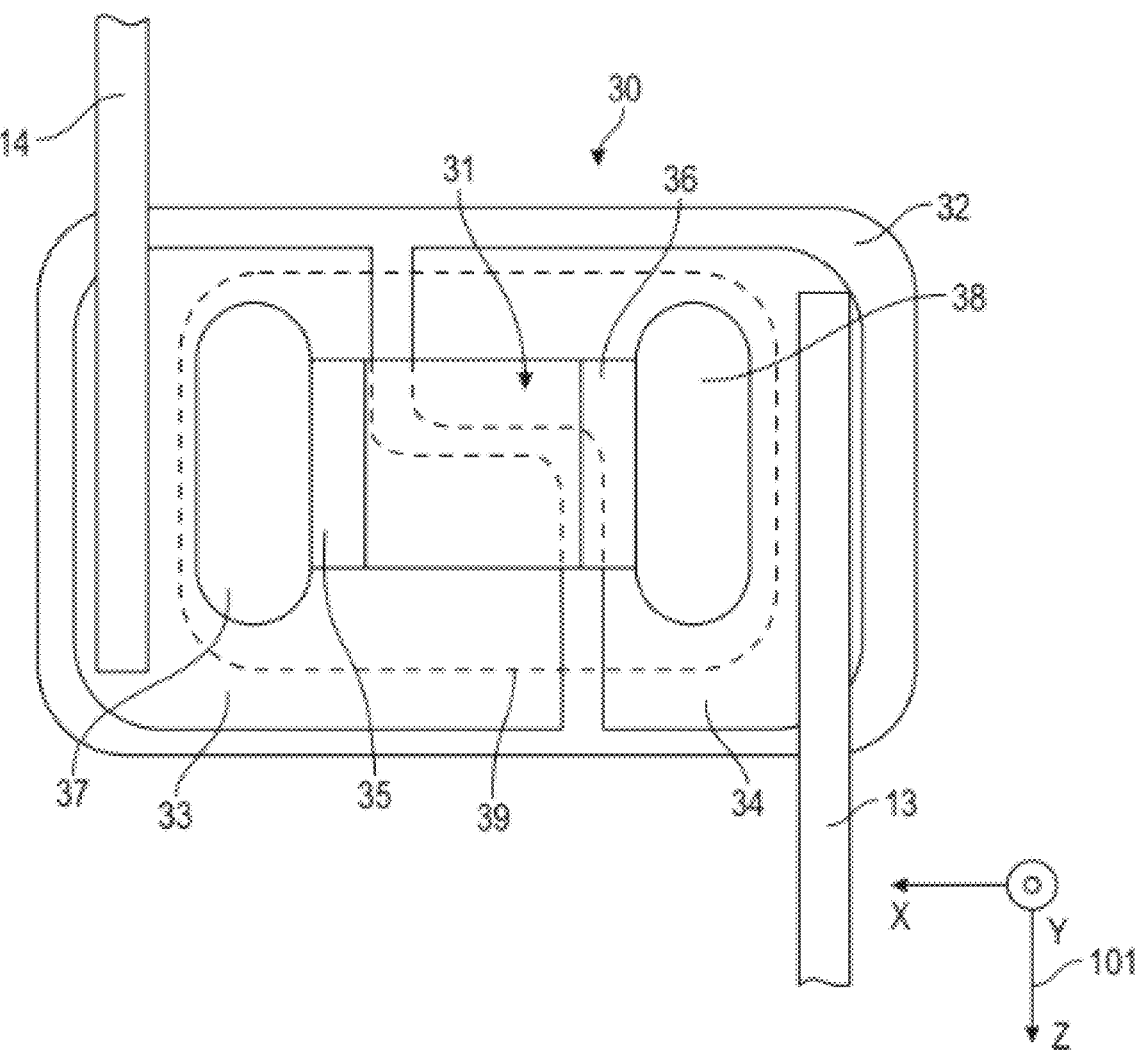
FIG. 4 shows a capacitor module of an inlay element of FIGS. 2 and 3.
Figure 5:
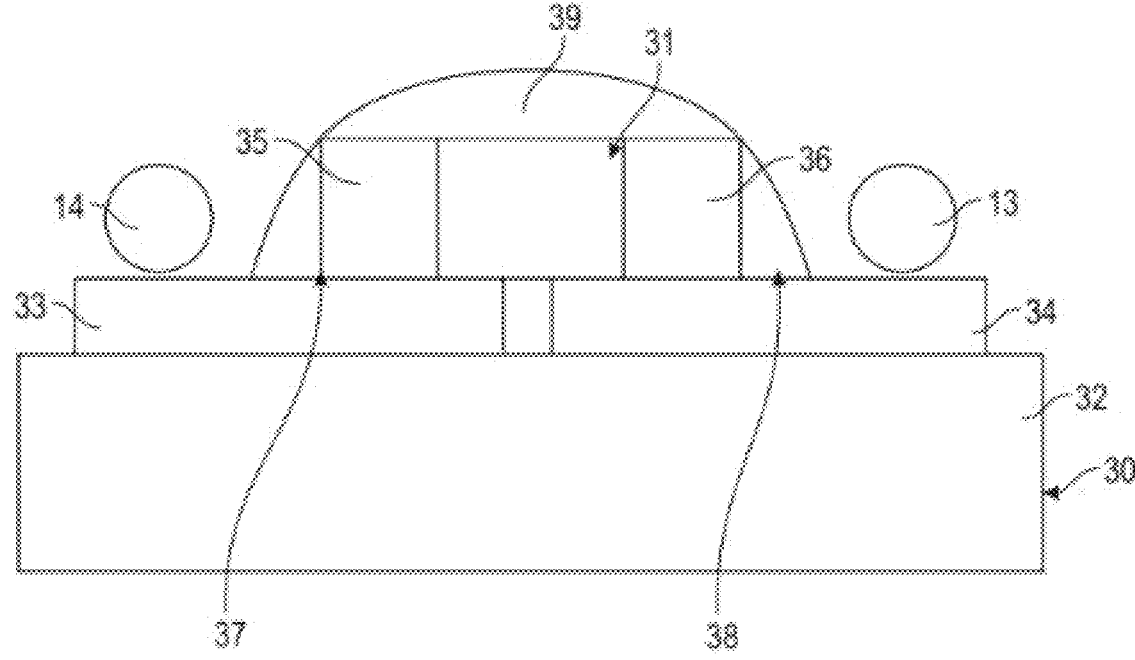
FIG. 5 shows a cross-section through the capacitor module of FIG. 4.

FIG. 4 and FIG. 5 detail components of the capacitor module 30 within the inlay element 60 for a smart card 100. The capacitor module 30 includes a tuning capacitor C1 31 mounted on a flexible capacitor PCB 32. The module features first and second metal pads 33, 34, which are connected to respective first and second contacts 35, 36 via first and second connective materials 37, 38. The assembly is encapsulated by a plastic cover material 39.

FIG. 4 shows a plan view of the capacitor module 30 where the tuning capacitor C1 31 is central, with the first and second contacts 35, 36 extending outward to the periphery to connect with end sections of the second antenna coil (not shown in this figure). The flexible nature of the capacitor PCB 32 allows for integration within the layered structure of the inlay element 60, conforming to its contours.

FIG. 5 provides a cross-sectional view taken along the line A-A of FIG. 2. It exhibits the capacitor 31 elevated above the surface of the flexible capacitor PCB 32, with the first and second connective materials 37, 38 providing an electrical connection to the first and second metal pads 33, 34. The plastic cover material 39 serves to protect the capacitor 31 and its connections. FIG. 5 serves to demonstrate the layered arrangement and the vertical interconnectivity between the capacitor module components and the surrounding structures of the inlay element 60.

Figure 6:
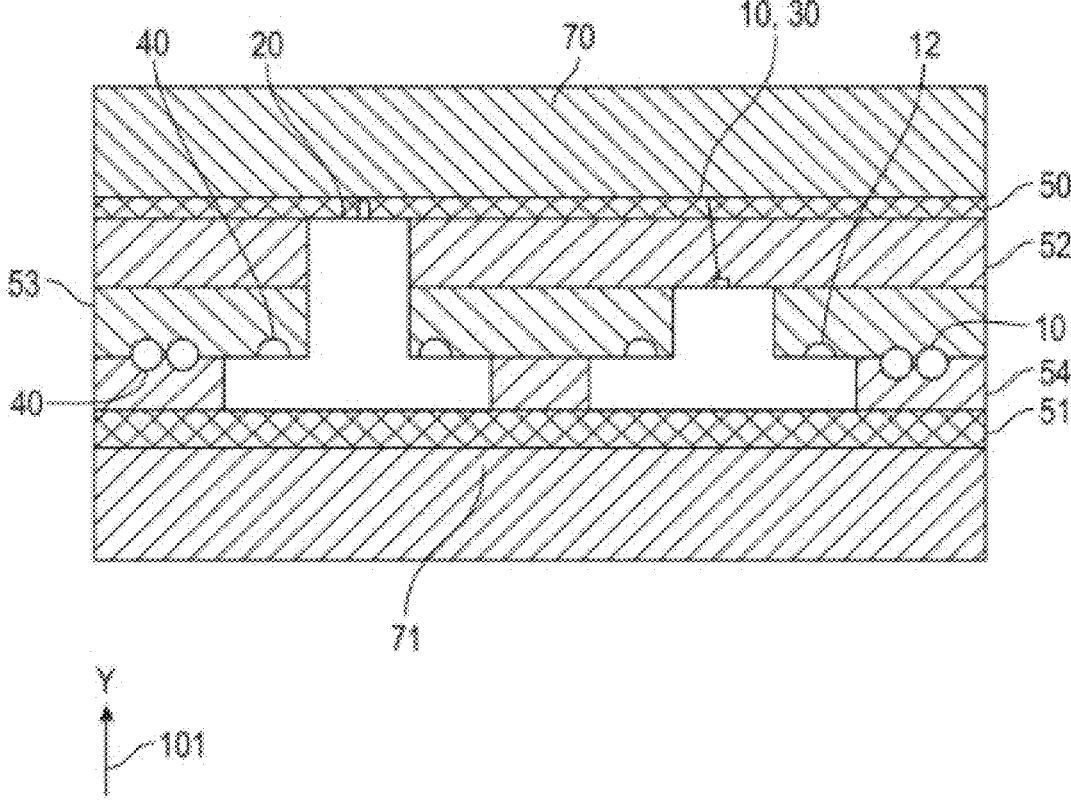
FIG. 6 shows a sideview of an arrangement for manufacturing an inlay element according to the application.

FIG. 6 shows a sideview of an arrangement for manufacturing an inlay element 60 according to the application FIG. 6 provides a side view of an inlay element 60 during the manufacturing process, illustrating a lamination step in the making of smart cards 100. The method includes the following steps:

Providing a sheet made of an antenna layer 54 with multiple layers and cut-out sections designed to receive OLED modules 20, contactless chip modules 11, and capacitor modules 30.

Applying adhesive tape to the bottom surface 65 of the antenna layer sheet, covering the cut-out sections to secure the modules when placed.

Inserting OLED modules 20, contactless chip modules 11, and capacitor modules 30 into the cut-out sections, affixing them to the adhesive tape.

Adding a multitude of first antenna coils 10 onto the antenna layer sheet and connecting them with the contactless chip modules 11 and capacitor modules 30.

Placing several second antenna coils 12 on the sheet and connecting them with the OLED modules 20.

Arranging a first compensation layer sheet 53 with cut-outs for the modules on the top surface 66 of the antenna layer sheet, allowing the modules to fit into the cut-outs of the first compensation layer.

Optionally, the adhesive tape can be removed from the bottom surface 65 after the modules are secured by their connections.

Positioning a first overlay layer sheet 51 onto the bottom surface 65 of the antenna layer sheet.

Laying a second overlay layer sheet 50 on the top surface of the first compensation layer sheet 53.

Collating and laminating the antenna layer sheet 54, first compensation layer sheet 53, first overlay layer sheet 51, and second overlay layer sheet 50 with the application of heat and/or pressure, using an upper lamination plate 70 and a lower lamination plate 71.

In an embodiment not shown here, there are release liners arranged between the upper lamination plate 70 and second overlay layer sheet 50 and between the lower lamination plate 71 and the first overlay layer sheet 51.

In a further embodiment not shown here, there is adhesive provided between the upper second overlay layer sheet 50 and the first compensation layer sheet 53, and/or between the upper second overlay layer sheet 50 and between the second compensation layer sheet 52 if that optional second compensation layer sheet 52 is provided because of thickness requirements. Such adhesive can also be provided between the antenna layer sheet 54 and the first compensation layer sheet 53.

Figure 7:
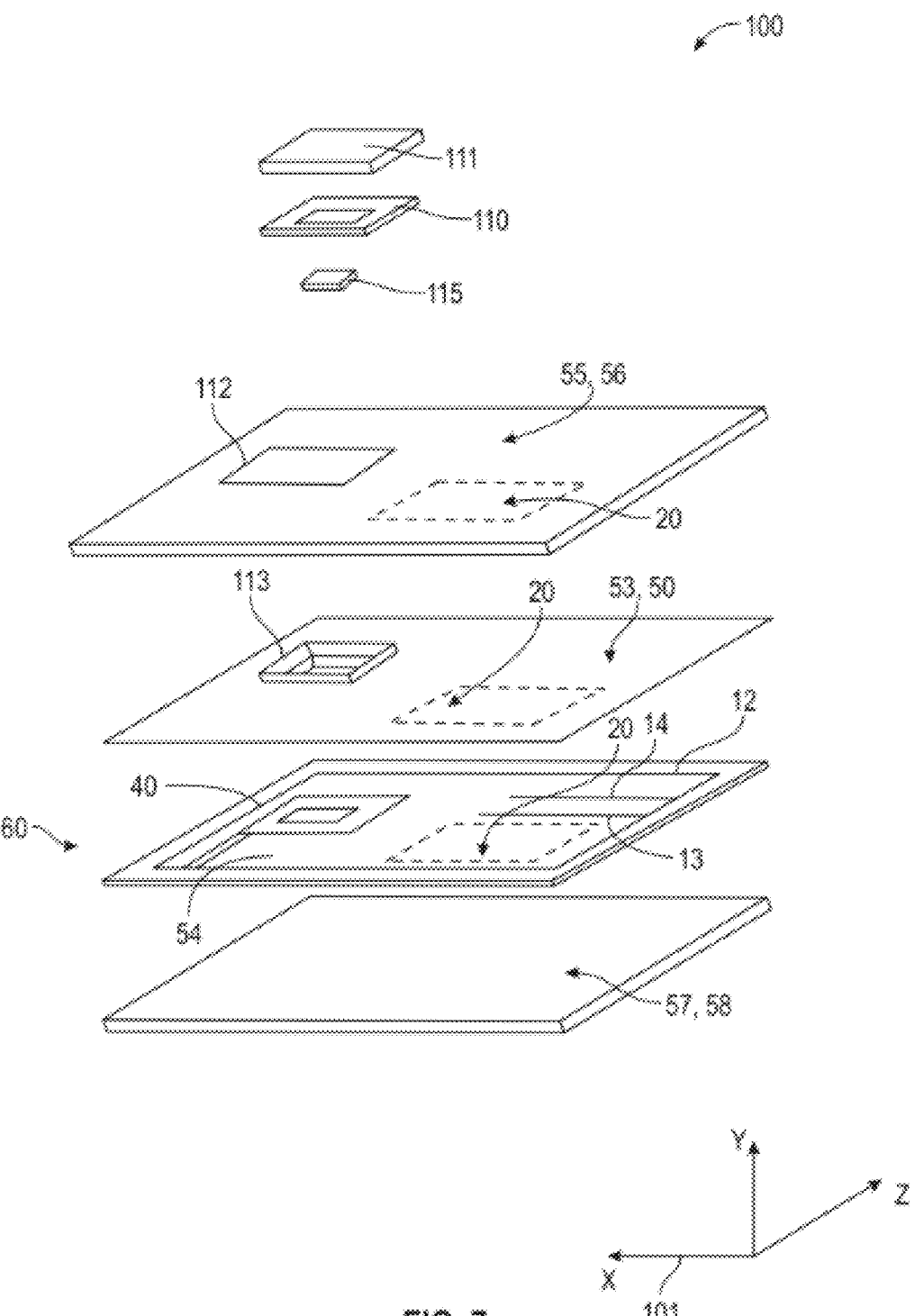
FIG. 7 shows a perspective exploded view of a chipcard according to the application.

FIG. 7: FIG. 7 shows a perspective exploded view of a chipcard according to the application FIG. 7 depicts a perspective exploded view of a further embodiment of a dual-interface smart card 100. The smart card 100 comprises an antenna layer 54. On the antenna layer's top surface, a first antenna coil 10 and a second antenna coil 12 are placed to harness electrical energy through inductive coupling with an external reader.

A first compensation layer 53 is situated atop the the antenna layer 54 to maintain the smart card's structural integrity. Embedded within the antenna layer 54 and the first compensation layer 53 is an OLED module 20. The first antenna coil 10 is connected in series to the OLED module 20 through a rectifier assembly, providing power to the OLED module 20.

Positioned beneath the antenna layer 54 on the bottom surface is a first overlay layer 51, lending structural support and insulation to the smart card 100. Above the the the first compensation layer 53, a light-transmissive second overlay layer 50 is placed, which facilitates visibility of the OLED module 20.

Further enhancing the smart card's functionality is a third antenna coil 40, which is galvanically coupled to the second antenna coil 12 and also positioned on the antenna layer 54. This provides the smart card's dual-interface functionality. Integrated within the antenna layer 54 and first compensation layer 53 is a capacitor module 30, which is connected to the second antenna coil 12, serving as a tuning element for the smart card 100.

An ICT element, not shown here, connects the first antenna coil 10 with the OLED panel of the OLED module 20. This ICT element includes a first connection element and a second connection element, both designed to sustain shear forces and ensure stable electrical connectivity with the OLED panel 21.

The assembly is completed with a dual-interface chip, seated on a chip module PCB that matches chip module openings. These openings are designed for the proper placement and integration of the chip module within the card structure. Encasing the chip module and its connections are a plastic cover layer and a transparent plastic top layer, providing protection and ensuring the longevity and functionality of the card.

The manufacturing process of the inlay element 60 for the smart card 100 involves precise placement of components within the antenna layer 54, connection of these components to their respective antenna coils 10, 12, and lamination of the entire assembly with the application of heat and pressure facilitated by lamination plates. Special attention is given to the thermal compression bonding process to avoid damage to heat-sensitive elements such as the OLED module 20.

Figure 8:
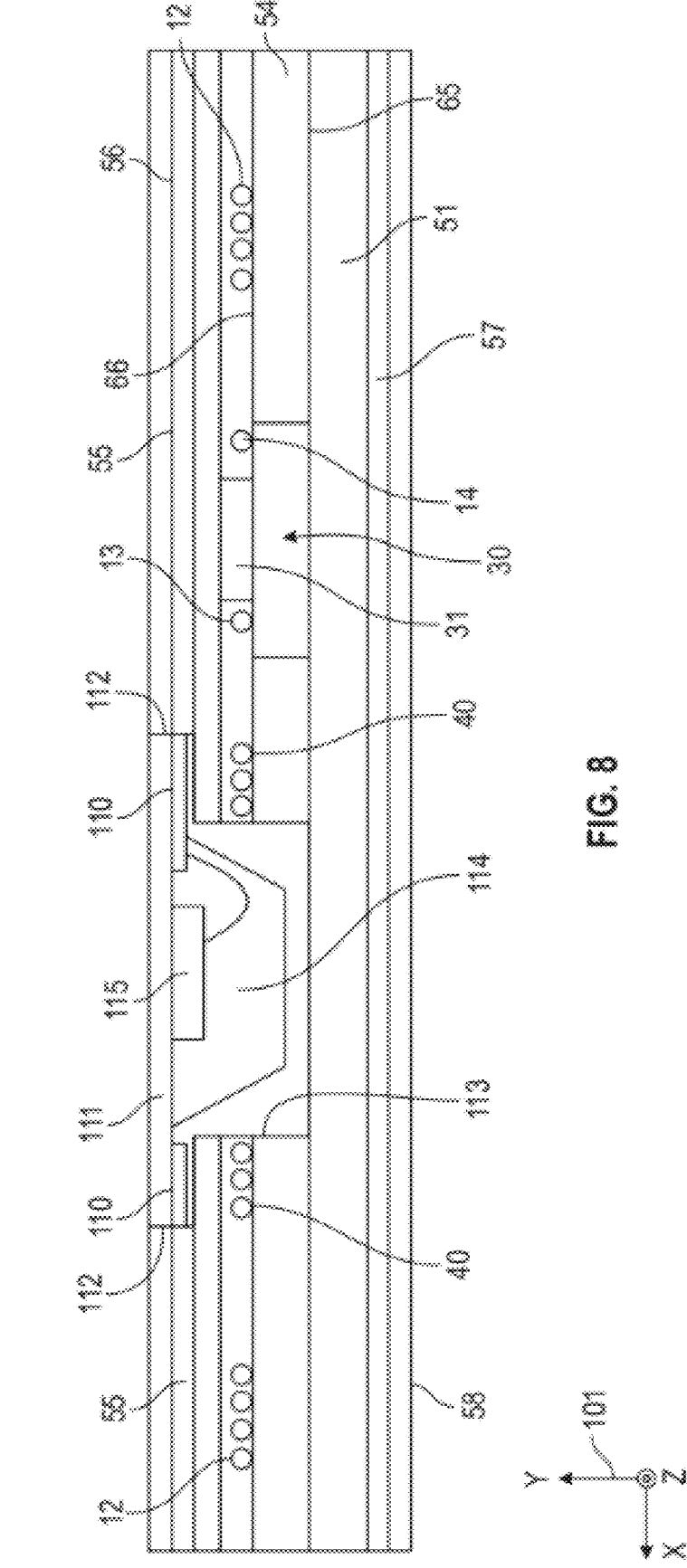
FIG. 8 shows a cross-section through the chipcard of FIG. 7.

FIG. 8 provides a cross-sectional view of the smart card 100 as detailed in embodiment 3, which includes the elements seen in FIG. 7, along with additional features.

At the core of the smart card is the antenna layer 54. Affixed to the top surface 66 of the antenna layer 54 are the first antenna coil 10 and the second antenna coil 12, providing the card's contactless functionality through inductive coupling. The third antenna coil 40, which enables dual-interface capabilities, is also positioned on this surface and is coupled to the second antenna coil 12.

Above the antenna layer 54, the first compensation layer 53 and the second compensation layer 52 are layered successively. Within these layers, the OLED module 20 is embedded, drawing power from the first antenna coil 10 through a connection to the rectifier assembly. The OLED module 20 is situated such that it benefits from the light transmission properties of the second overlay layer 50 positioned above the second compensation layer 52.

Below the antenna layer 54 is situated the first overlay layer 51. Within the confines of these layers, the capacitor module 30 is partially housed, with its tuning capacitor 31 visible in the section, connected to the third antenna coil 40 for tuning the frequency response of the card's elements.

Visible within the smart card structure are the chip module PCB 111 and the dual-interface chip 115, which are encapsulated by the second plastic cover layer 55 and the second transparent plastic top layer 56. These protective layers 55 and 56 ensure the dual-interface chip's security and functionality within the smart card 100. Additionally, the chip module PCB 111 matches a chip module opening 112. A plastic chip cover material 114 protects the dual-interface chip 115.

Figure 9:
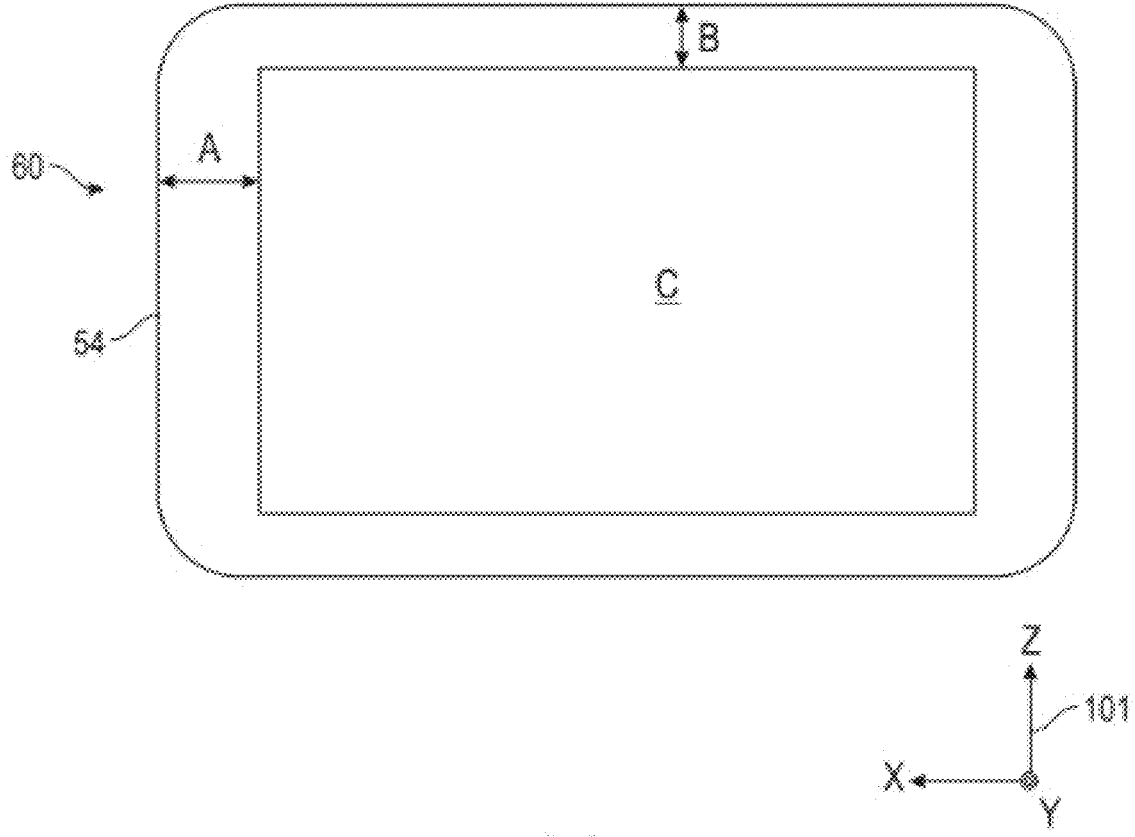
FIG. 9 shows a top view of a further embodiment of an inlay element of the application.
Figure 10:
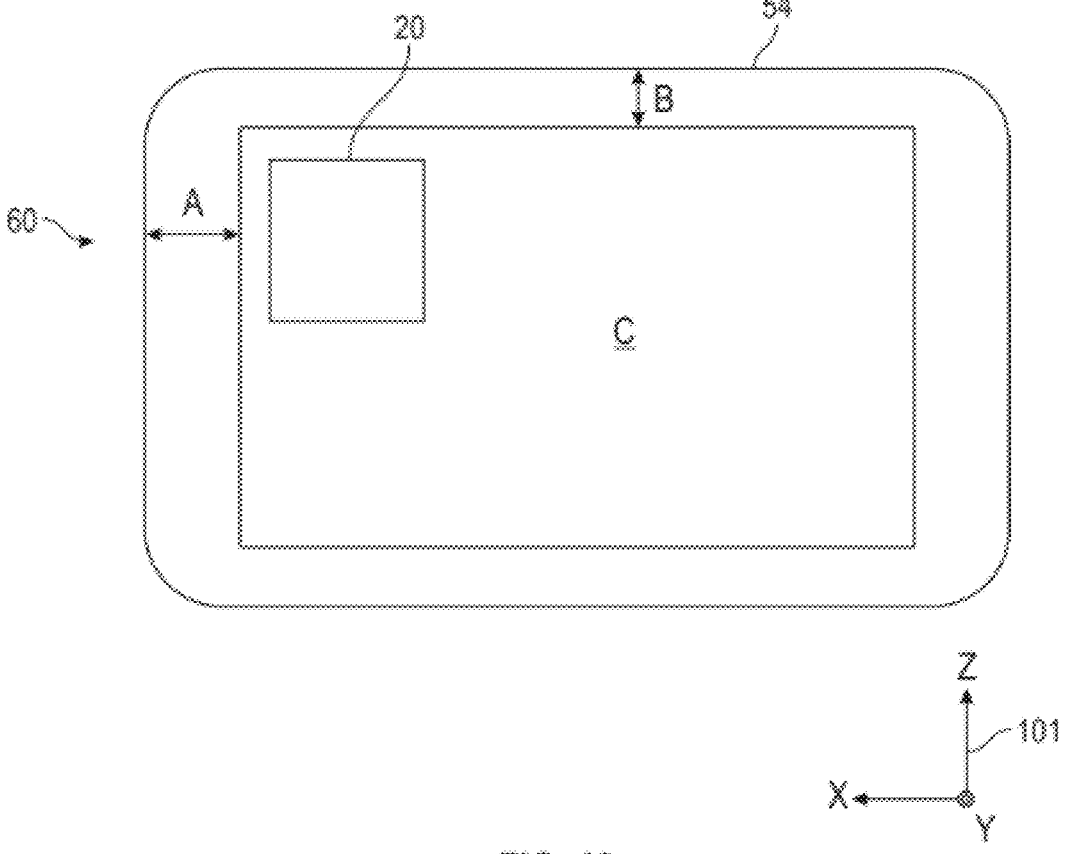
FIG. 10 shows a top view of a further embodiment of an inlay element of the application.
Figure 11:
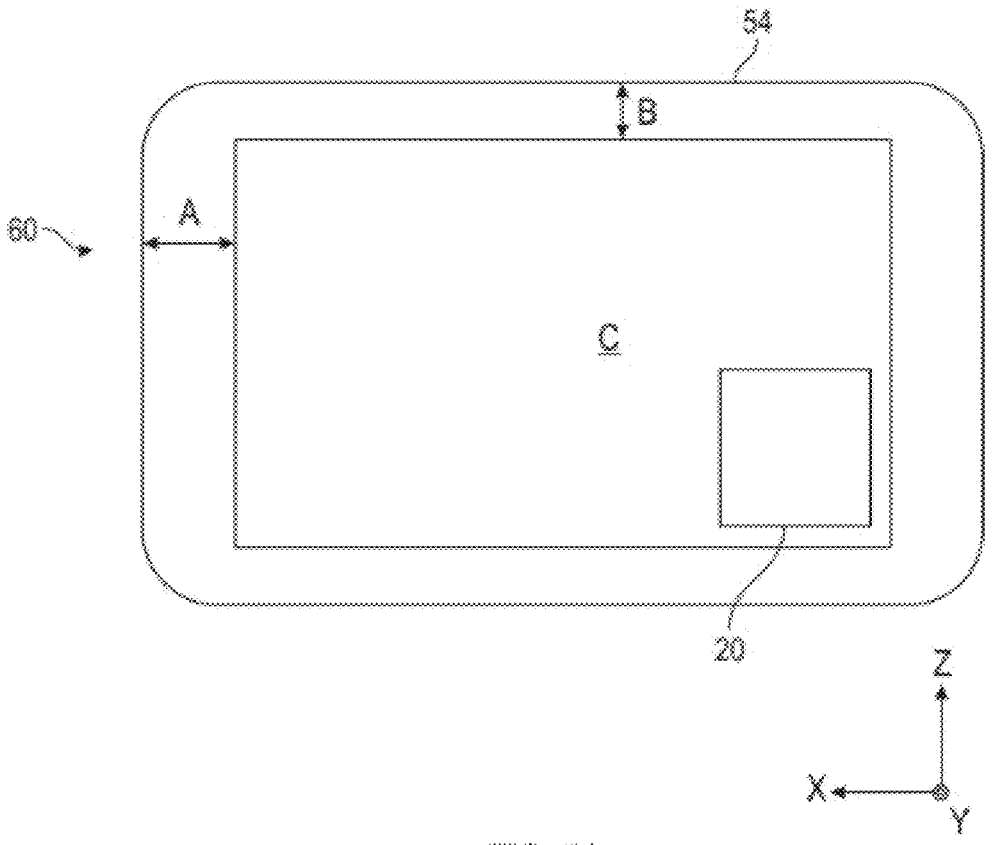
FIG. 11 shows a top view of a further embodiment of an inlay element of the application.

FIGS. 9, 10, and 11 exhibit top views of inlay elements 60 for further embodiments of the application, respectively. Each figure highlights the positioning of an OLED element 20 in relation to a first antenna coil (not shown in these figures) within an inlay element 60. The OLED element 20 is placed within an enclosed area C of the inlay element 60. This area C is defined by specific distances A and B to the edges of the inlay element 60, ensuring precise placement of the OLED element 20 for an improved function and integration within the smart card structure.

In FIG. 9, the inlay element 60 is shown without the OLED element 20, providing a view of the area C where the OLED element 20 is to be situated.

FIG. 10 displays the inlay element 60 with the OLED element 20 placed within the defined area C, demonstrating the alignment and orientation of the OLED element 20 in the context of the inlay element's overall dimensions.

FIG. 11 also presents the inlay element 60 with the OLED element 20 positioned accordingly within area C, emphasizing the the distances A and B in the design and assembly of the smart card's inlay element 60.

These figures collectively illustrate the variations in the placement of the OLED element 20 within the inlay element 60 for different embodiments of the smart card, showcasing the adaptability of the design to accommodate various configurations of the internal components.

Figure 12:
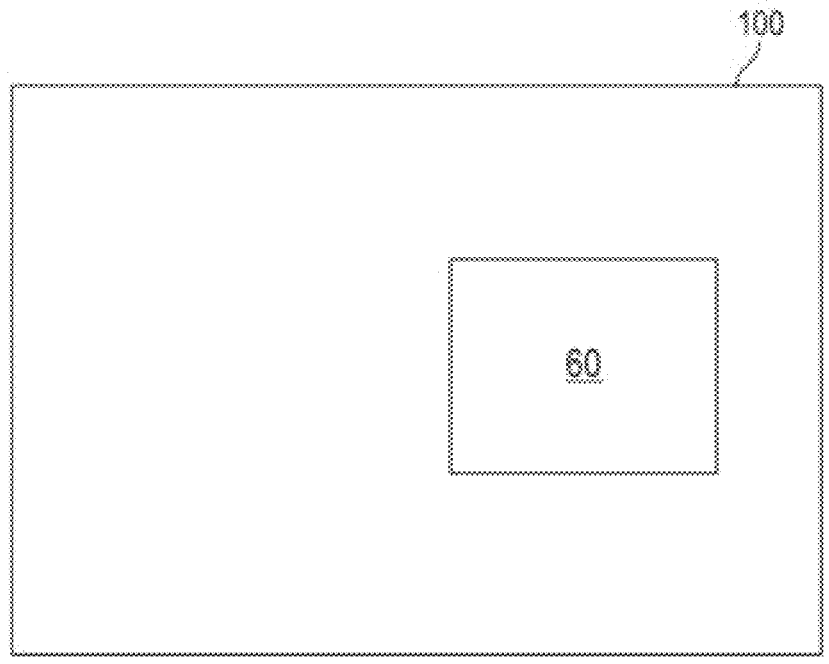
FIG. 12 shows a schematic view of a smart card with an inlay.

FIG. 12 shows a schematic view of a smart card 100 incorporating an inlay element 60 as per the application. The smart card 100 integrates a first plastic cover layer 57 on the bottom side of the first overlay layer 51. Additionally, there may be a second plastic cover layer 55 provided on the top side of the second overlay layer 50. These layers, typically made from PVC, serve as protective coverings for the inlay element 60. They not only protect the card but also offer a surface that can be utilized for adding graphical designs to enhance the card's aesthetic appeal.

Moreover, the smart card 100 can include a first transparent plastic layer 58 on the bottom side of the first plastic cover layer 57, and there may also be a second transparent plastic layer 56 on the top side of the second plastic cover layer 55. Made from transparent PVC, these layers function to safeguard any graphical design that might be present on the first plastic cover layer 57. Furthermore, the second transparent plastic layer 56 ensures that the card's visual elements are visible while also contributing to the card's overall durability.

Figure 13:
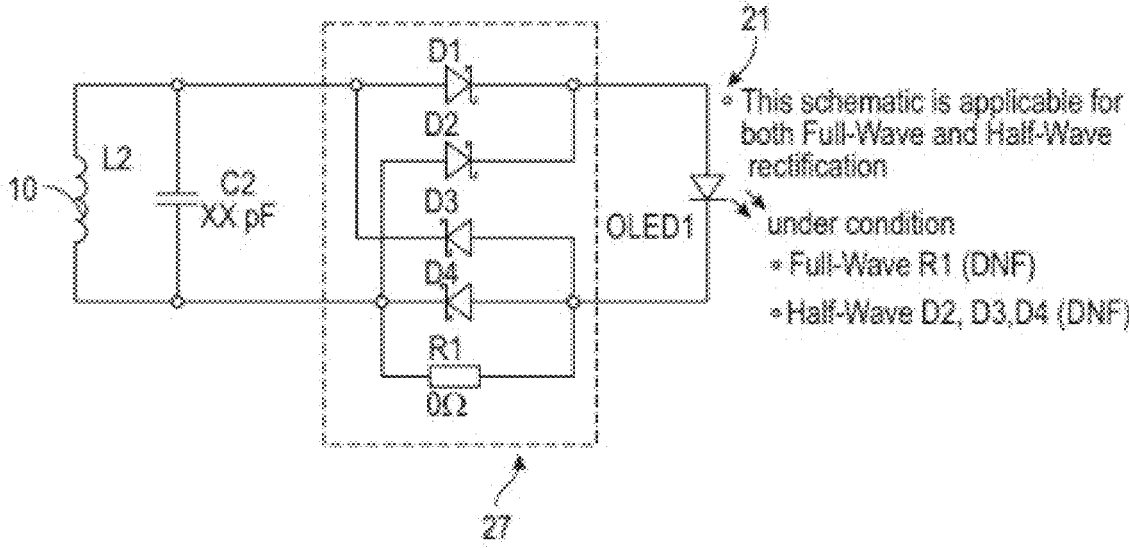
FIG. 13 shows a schematic of a rectifier assembly according to the application.

FIG. 13 displays the schematic of a rectifier assembly 27, as outlined in the application. This assembly is integral to the ICT element 22, which facilitates the electrical connection of an OLED panel with the end sections of a first wire and a second wire.

The ICT element 22 consists of an insulating substrate upon which a first connection pad and a second connection pad are located on the top surface. These pads are designed to receive the end sections of the first and second wires, respectively. Also positioned on the insulating substrate's top surface are a first connection element and a second connection element. The first connection element is intended for electrical connection to the anode of the OLED panel, while the second connection element is for the cathode.

The rectifier assembly 27 is electrically interposed between the first connection pad and the second connection pad, as well as between the first connection element and the second connection element. This assembly includes conductive traces present on both the top and bottom surfaces of the insulating substrate, facilitating the connection to the cathode of the OLED panel.

Further details of the ICT element 22 specify that the rectifier assembly 27 incorporates a smoothing capacitor C2 that interconnects the first connection pad and the second connection pad. Additionally, the assembly comprises conductive traces and landing pads for accommodating a conductive element R1, known as a zero-ohm resistor, and a rectifier diode D1. These components create electrical connections between the connection pads and the connection elements.

The rectifier assembly 27 is also characterized by having conductive traces and landing pads for the inclusion of a set of diodes-D1, D2, D3, and D4. These diodes form a bridge rectifier, which is a circuit that allows for both full-wave and half-wave rectification. In the context of this schematic, the bridge rectifier provides a means to electrically connect the first connection pad, the second connection pad, the first connection element, and the second connection element.

The schematic indicates applicability for both full-wave and half-wave rectification, contingent upon certain conditions: for full-wave rectification, the resistor R1 is not fitted (DNF, do not fit), and for half-wave rectification, the diodes D2, D3, and D4 are not fitted (DNF). This flexible design allows for customization based on the specific requirements of the smart card application.

Figure 14:
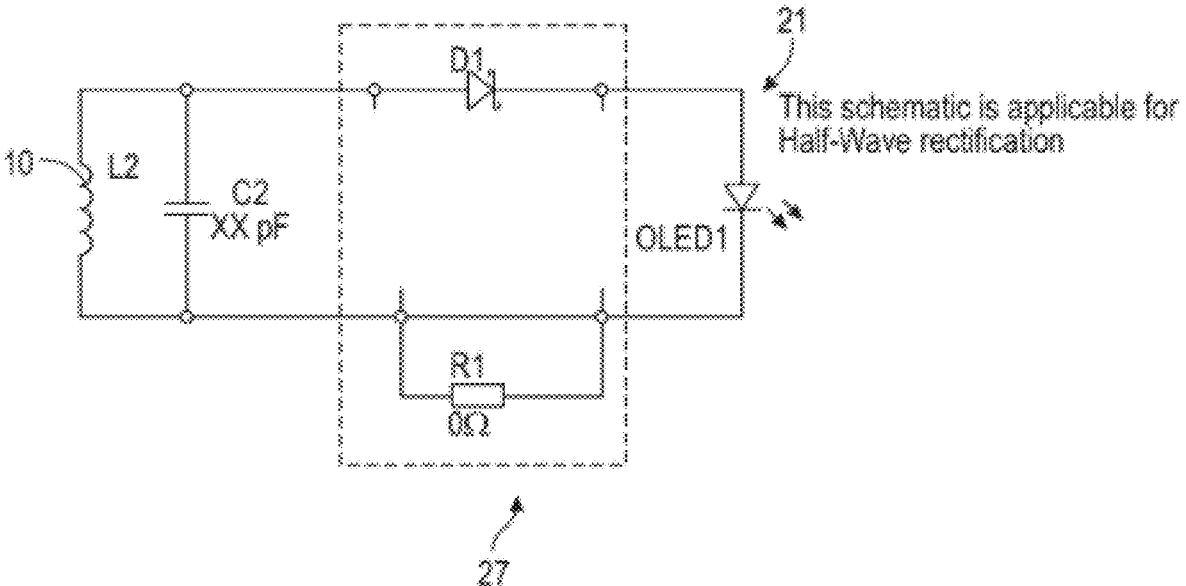
FIG. 14 shows a schematic of half-wave rectifier assembly according to the application.

FIG. 14 illustrates the schematic of a half-wave rectification circuit, part of the rectifier assembly 27 designed for use with an ICT element. This schematic provides the functioning of an OLED panel 21, allowing for the conversion of alternating current (AC) into direct current (DC).

The circuit features a first antenna coil 10, which is the primary inductive component responsible for receiving and inducing electrical current. Connected to this first antenna coil 10 is a smoothing capacitor C2, which serves to reduce voltage fluctuations in the rectification process, stabilizing the DC output.

A single rectifier diode D1 is placed in the path of the current, allowing electricity to flow in only one direction, thereby converting the AC input from the antenna coil 10 into a half-wave rectified DC output. This DC current is then utilized to power the OLED panel 21, denoted in the schematic as OLED1.

The inclusion of a resistor R1, depicted as a zero-ohm resistor, signifies a direct connection in the circuit, often used as a jumper or a place-holder that can be replaced with other components if needed for different circuit configurations.

This schematic is exclusively applicable for half-wave rectification, as indicated, which is a simple form of rectification used where full-wave rectification is not required.

Figure 15:
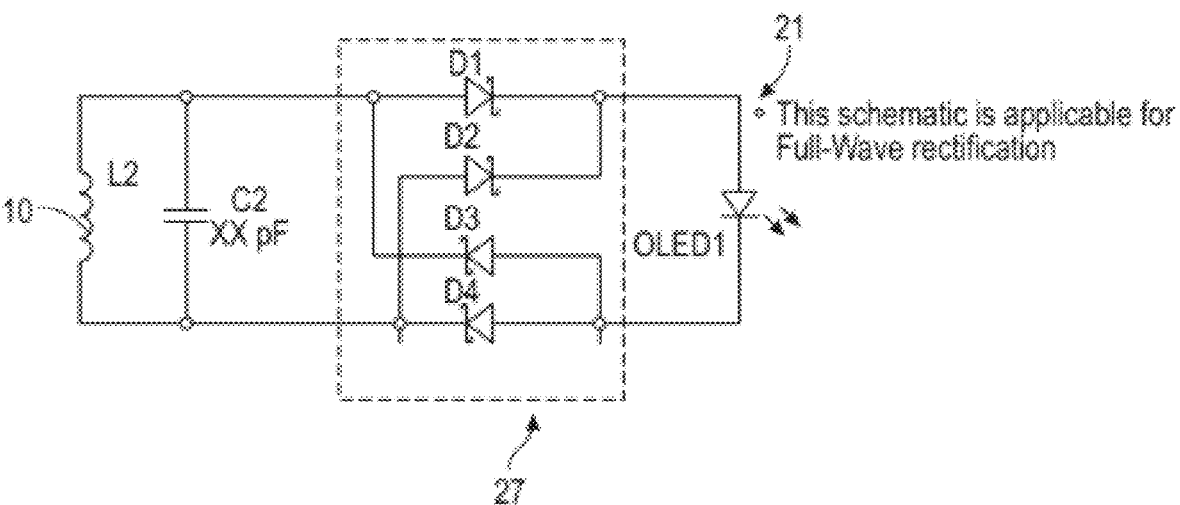
FIG. 15 shows a schematic of half-wave rectifier assembly according to the application.

FIG. 15 shows a schematic of a full-wave rectification circuit, which is part of the rectifier assembly 27 as specified in the application. This rectification circuit is designed for use with an ICT element and is crucial for the operation of an OLED panel 21.

In the diagram, a first antenna coil 10 is the primary component for capturing AC electricity through inductive coupling. Attached to it is a smoothing capacitor C2, which serves to minimize voltage ripples in the output, thereby delivering a more consistent DC voltage.

The full-wave rectification is achieved using a bridge rectifier configuration, which consists of four rectifier diodes D1, D2, D3, and D4. These diodes are arranged in such a way that they allow the current to pass through them in one direction during each half cycle of the AC waveform, effectively utilizing both halves of the cycle to produce a full-wave rectified DC output. This DC output powers the OLED panel, marked as OLED1 in the schematic.

This schematic is specifically applicable for full-wave rectification, a more efficient rectification method compared to half-wave rectification, as it utilizes the entire AC waveform, resulting in less ripple and a smoother DC output.

Figure 16:
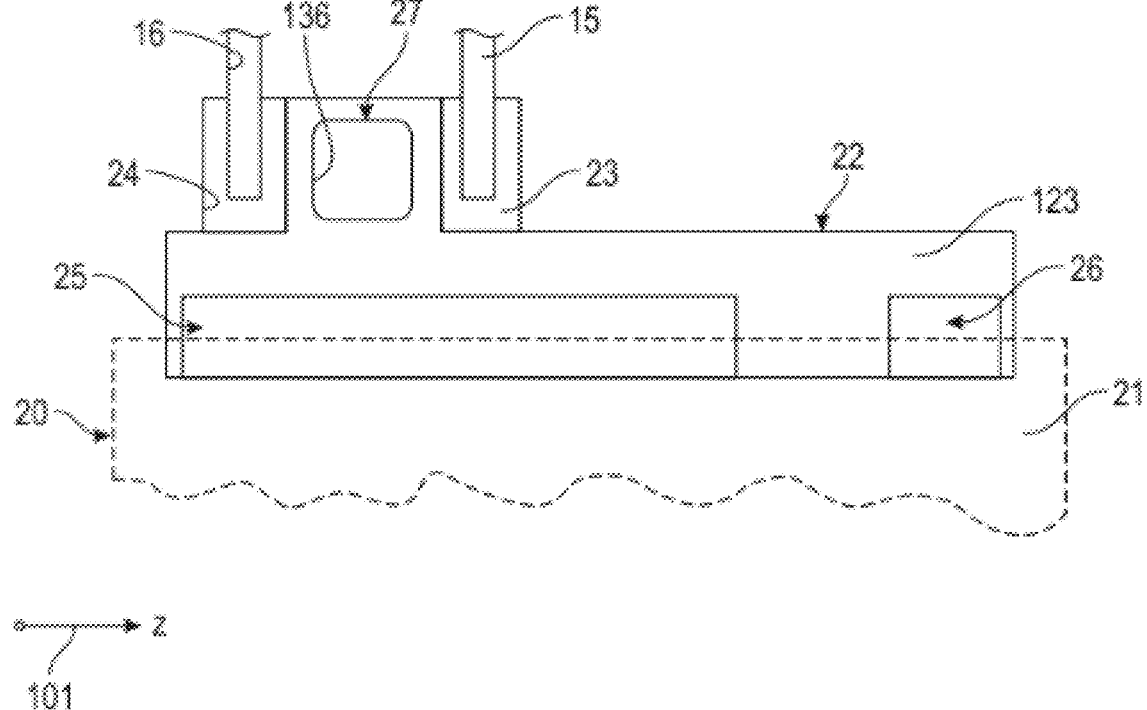
FIG. 16 shows a top view of an ICT element according to the application.

FIG. 16 provides a top view of an ICT element 22 designed for electrical connection within a smart card system. This element includes an insulating substrate 132, upon which a first connection pad 23 and a second connection pad 24 are mounted. These pads 23, 24 receive end sections 15 and 16 of two wires, facilitating the electrical connection to an OLED panel 21.

The ICT element 22 comprises the rectifier assembly 27. This rectifier assembly 27 comprises conductive traces and is placed between the first and second connection pads 23, 24, and the first and second connection elements 25, 26. The rectifier assembly's 27 role is to convert alternating current (AC) harvested by the first antenna coil 10 into direct current (DC), which is suitable for use by the OLED panel 21, represented schematically in this figure.

The rectifier assembly 27 is equipped with components necessary for the rectification process, including diodes and a capacitor, to ensure the OLED panel 21 receives a stable DC power supply. The layout is designed to provide an efficient and reliable power conversion within the compact space of a smart card.

Figure 17:
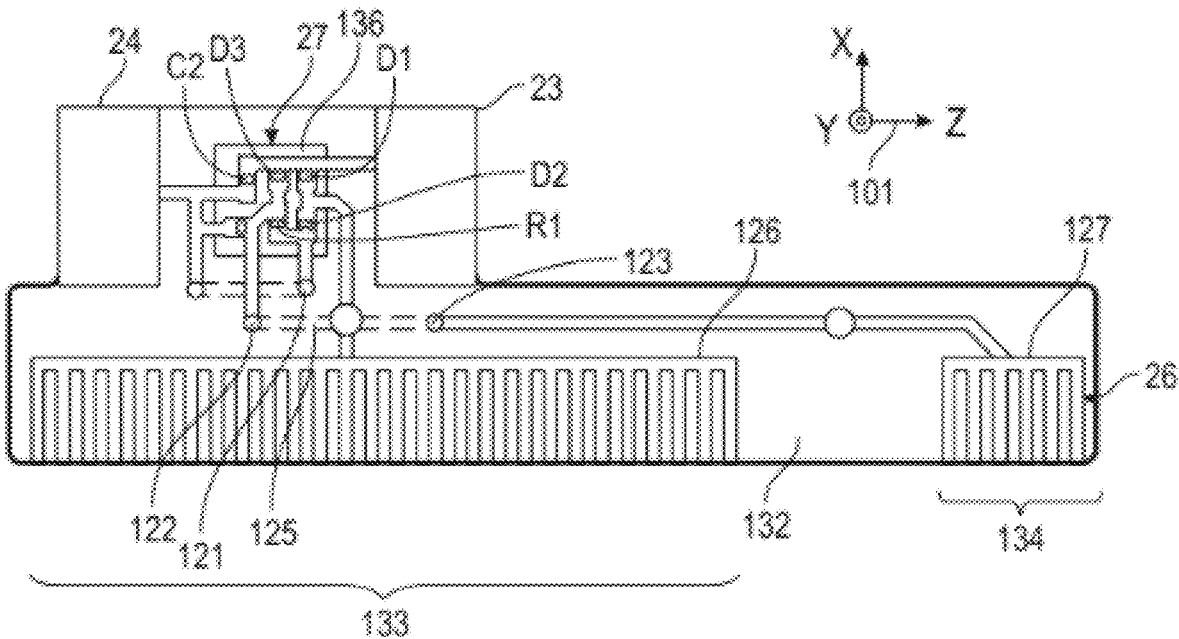
FIG. 17 shows a detailed view of the ICT element of FIG. 16.
Figure 18:
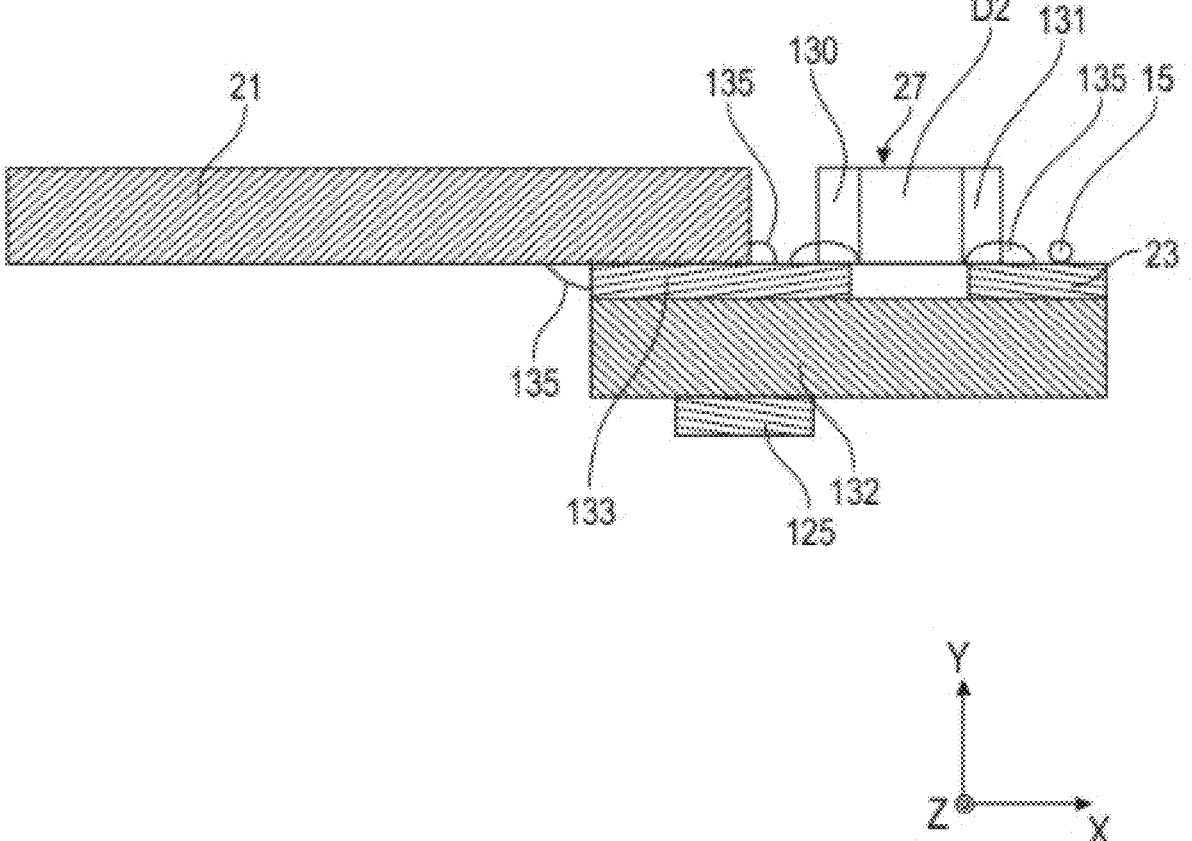
FIG. 18 shows a cross-sectional view of the ICT element of FIG. 16 and FIG. 17.

FIGS. 17 and 18 show different views of the ICT element 22 of FIG. 16, providing detailed insight into the component layout and connections as specified in the application.

FIG. 17 presents a detailed top view of the ICT element 22. This ICT element 22 comprises an insulating substrate 132, which supports a first connection pad 23 and a second connection pad 24 on its top surface. These pads 23, 24 connect to the end sections 15 and 16 of the first and second wires, respectively. Additionally, a first connection element 25 and a second connection element 26 are provided on the top surface of the insulating substrate 132 for establishing connections with the anode and cathode of an OLED panel 21, respectively.

This ICT element 22 comprises a rectifier assembly 27, which includes a smoothing capacitor C2 and rectifier diodes D1, D2, D3, and D4. The rectifier assembly 27 is configured to convert AC to DC, supplying power to the OLED panel 21. The assembly is also equipped with conductive traces and landing pads for a zero-ohm resistor R1, further facilitating the electrical connection between the connection pads 23, 24 and connection elements 25, 26.

FIG. 18 provides a cross-sectional view of the ICT element 22, illustrating the vertical integration of the component layers. The insulating substrate 132 serves as the base, with the rectifier assembly 27 positioned above it. Visible in this cross-section are the conductive traces and landing pads on the insulating substrate 132, along with the rectifier diodes D2 and the smoothing capacitor C2, which are critical for the full-wave rectification process. The rectifier diodes form a bridge configuration, allowing for conversion of AC from the first antenna coil (not shown in this figure) to a DC output for the OLED panel 21.

These figures collectively detail the design and functionality of the ICT element 22, showcasing the patent's approach to providing a reliable power management solution for OLED panels within smart card applications.

The application also comprises the subject matter of the combinations and/or permutations that follow from the following itemized lists, that also comprises terms and definitions that are used elsewhere in the application. The following itemized list is not only intended for providing combinations and/or permutations among these items but these items can also be combined with each one of the patent claims that are comprised in the present application:

1. Inlay element for a smart card, comprising:
   an antenna layer;
   a first antenna coil being arranged on a top surface the antenna layer;
   a second antenna coil being arranged on the top surface of the antenna layer;
   a first compensation layer being arranged on the top surface of the antenna layer;
   an LED module being arranged at least partially within the antenna layer and within the first compensation layer,
   and/or
   1.a. The term LED can stand for any illuminating means, including micro-LEDs or OLEDs.
   and/or
   1b A first overlay layer is arranged below a bottom surface of the antenna layer, wherein a transmissive second overlay layer being arranged above a top surface of the first compensation layer.

and/or
   1c. In the context of this application, the properties of light transmission through materials can categorized as follows: Transparent materials are those that allow light to pass through with minimal scattering, rendering objects on the opposite side distinctly visible with clear details and accurate colors, akin to ordinary window glass. Translucent materials, in contrast, permit the passage of light but disperse it in the process, resulting in a scenario where light is transmitted but the clarity of object visibility is significantly reduced, manifesting as a blurred or softened view, similar to frosted glass. The overarching term 'transmissive' is employed to refer to both these categories, encompassing any material that allows the passage of light, irrespective of the degree of clarity or distortion introduced during its transmission.
   and/or
   the first antenna coil is galvanically decoupled—which can mean that there is no direct electrical connection between the two coils—from the second antenna coil, and wherein the first antenna coil and the LED module are connected in series with a rectifier assembly. The first antenna coil is configured to provide electrical energy for the LED module via inductive coupling of the first antenna coil with an external reader, and/or
   "Top" and "bottom" is meant in the sense of the y-direction in the Figures.

2. Inlay element according to item 1, wherein a second compensation layer being arranged between the first compensation layer and the second overlay layer. These compensation layers can provide additional thickness for compensating differences in height between the LED module and the capacitor module and/or the contactless chip module, as one can see in FIG. 3, for example.

3. Inlay element according to item 1 or item 2, further comprising a third antenna coil being galvanically coupled with the second antenna coil, the third antenna coil being arranged on the top surface of the antenna layer, which is for a dual interface card.

4. Inlay element according to item 3, further comprising a capacitor module being arranged at least partially within the antenna layer and within the first compensation layer, contact pads of the capacitor module being connected—for example in series—with end sections (13, 14) of the second antenna coil, thereby optionally providing a tuning capacitor.

5. Inlay element according to item 1 or item 2, further comprising a contactless chip module being arranged at least partially within the antenna layer and within the first compensation layer. This setup is often used for a contactless chip card.

6. Inlay element according to item 4, wherein end sections (13, 14) of the second antenna coil are connected with antenna pads of the contactless chip module. These are optionally being connected in series and configured to provide electrical energy for the contactless chip module via inductive coupling of the second antenna coil with the external reader.

7. Inlay element according to any of the preceding items, further comprising an ICT element for connecting the first antenna coil with an LED panel of the LED module, the ICT element further comprising the rectifier assembly. In such a setup, the ICT element can be configured to provide electrical energy for the LED module.

8. Inlay element according to item 7, wherein the ICT element comprises a first—possibly comb-shaped—connection element 25 and a second—possibly comb-shaped—connection element 26 for contacting the LED panel. Such connection elements can take over shear forces, wherein each pole of the LED panel has one connection element.

9. Inlay element according to any of the preceding items, wherein the LED module is arranged within an enclosed area (C) of the first antenna coil, the area (C) having specified distances (A, B) to edges of the inlay element.

10. Inlay element according to any of the preceding items, wherein the LED module comprises a LED panel with a specific color and a specific size. [question to inventor: please give colors, dimensions and provide technical effect].

11. Smart card comprising an inlay element according to any of the preceding items, wherein there is a first plastic cover layer-possibly made from PVC-provided on [the bottom side of] the first overlay layer and/or there is a second plastic cover layer—e.g. made from PVC-provided on—e.g. the top side of—the second overlay layer. This can be provided as a protective layer which can also be used for providing a graphical design.

12. Smart card comprising an inlay element according to any of the preceding items, wherein there is a first transparent plastic top layer-possibly made from transparent PVC-provided on—e.g. the bottom side of—the first plastic cover layer and/or there is a second transparent plastic top layer-possibly made from transparent PVC-provided on the top side of the second plastic cover layer. This can protect the graphical design on the first plastic layer and/or the second transparent plastic layer.

13. ICT element for electrically connecting a first end section of a first wire and a second end section of a second wire with an anode and with a cathode of an LED panel, comprising an insulating substrate, a first connection pad for receiving a first end section of a first wire and a second connection pad for receiving a second end section of a second wire, the first connection pad and the second connection pad being provided on a top surface of the insulating substrate, a first connection element for connecting to an anode of an LED panel and a second connection element for connecting to a cathode of an LED panel, the first connection element and the second connection element being provided on an upper surface of the insulating substrate, a rectifier assembly, being electrically connected between the first connection pad, the second connection pad, the first connection element and the second connection element, for connecting to a cathode of an LED panel, wherein the rectifier assembly comprising conductive traces both on the upper surface and on a—e.g. opposite—lower surface of the insulating substrate.

14. ICT element according to item 13, wherein the rectifier assembly comprises a smoothing capacitor C2 that connects the first connection pad and the second connection pad.

15. ICT element according to item 13 or item 14, wherein the rectifier assembly comprises conductive traces and landing pads for taking up a conductive element R1—e.g. a resistor with zero/0 ohms—and for a rectifier diode D1, the conductive element R1 and the rectifier diode D1 electrically connecting the first connection pad, the second connection pad, the first connection element and the and the a second connection element.

16. ICT element according to item 13 or item 14, wherein the rectifier assembly comprises conductive traces and landing pads for taking up a rectifier diode D1, a rectifier diode D2, a rectifier Diode D2, a rectifier Diode D3, and a rectifier Diode D4, the rectifier diode D1, the rectifier diode D2, the rectifier Diode D3, and the rectifier Diode D4 forming a bridge rectifier for electrically connecting the first connection pad, the second connection pad, the first connection element and the second connection element.

17a. Method of manufacturing an inlay elements sheet for making smart cards, comprising the steps:

providing an antenna layer plastic sheet with—possibly areas of—a plurality of antenna layers and with a plurality of cut-out sections—e.g. cavities or through-holes—for receiving LED modules, COB contactless chip modules and/or COB capacitor modules;

applying an adhesive tape layer at a bottom surface of the antenna layer plastic sheet, at least partly covering the plurality of cut-out sections, providing the LED modules, the COB contactless chip modules and/or the COB capacitor modules in the cut-out sections in the antenna layer plastic sheet, e.g. such that they stick to the adhesive tape layer, providing a plurality of first antenna coils on the antenna layer plastic sheet; and connecting the COB contactless chip modules and/or the COB capacitor modules with the respective first antenna coils-usually but not always it is one COB contactless chip modules that is connected with one first antenna coil or one COB capacitor module with one first antenna coil, providing a plurality of second antenna coils on the antenna layer plastic sheet, and connecting the LED modules with the respective second antenna coils, providing a first compensation layer plastic sheet with a plurality of cutout sections for the LED modules, for the COB contactless chip modules and/or for the COB capacitor modules and arranging the first compensation layer plastic sheet on the top surface of the antenna layer plastic sheet, such that the LED modules, the COB contactless chip modules and/or the COB capacitor modules fit into the respective cut-out sections in the first compensation layer plastic sheet;

17b. Method of item 17, with removing the adhesive tape layer from the bottom surface of the antenna layer plastic sheet. The LED modules, the contactless chip modules, and the contactless chip modules and the capacitor modules are now held by the connections with the antenna wires]

17c. Method of item 17a or item 17b, with providing a first overlay layer plastic sheet on the bottom surface of the antenna layer plastic sheet providing a second overlay layer plastic sheet on a top surface of the first compensation layer plastic sheet; and collating and laminating of the antenna layer plastic sheet, the first compensation layer plastic sheet, the first overlay layer plastic sheet, and the second overlay layer plastic sheet while applying heat and/or pressure.

18. Method of manufacturing an inlay elements sheet according to items 17 and 17b, wherein the steps of arranging a second overlay layer plastic sheet on a top surface of the first compensation layer plastic sheet, and collating and laminating of the antenna layer plastic sheet, the first compensation layer plastic sheet, the first overlay layer plastic sheet, and the second overlay layer plastic sheet while applying heat and/or pressure, are replaced by the following steps:

providing a second compensation overlay layer plastic sheet with a plurality of cutout sections for the LED modules on a top surface—wherein the term "top" can mean "higher" in the z-direction of the coordinate system—of the first compensation layer plastic sheet, such that the LED modules fit into the respective cut-out sections in the second compensation layer plastic sheet; and collating and laminating of the antenna layer plastic sheet, the first compensation layer plastic sheet, the second compensation overlay layer plastic sheet, the first overlay layer plastic sheet, and the second overlay layer plastic sheet while applying heat and/or pressure.

19. Method of manufacturing an inlay elements sheet according to item 17 or item 18, wherein the steps of connecting the COB contactless chip modules and/or the COB capacitor modules with the respective first antenna coils, and/or connecting the LED modules with the respective second antenna coils, are provided by thermal compression.

20. Method of manufacturing an inlay elements sheet according to item 19, wherein the thermal compression between the wire and the LED ICT only where the wire touches the LED module, because the LED can be heat sensitive, and the thermal compression between the respective end sections (14, 15) of the first antenna coil and a first connection pad and the second connection pad of the LED module is done without touching an LED panel of the LED module.

21. Method of manufacturing a chip card sheet for making smart cards, comprising the steps:

providing an inlay elements sheet according to one of items 17 to 20, providing a transmittent second plastic top layer sheet on the top surface of the second plastic cover layer.

22. Method of manufacturing a chip card sheet, comprising manufacturing a chip card sheet according to one of items 17 to 21, providing a first plastic top layer sheet on the bottom surface of the first plastic cover layer sheet.

23. Method of manufacturing a chip card sheet, comprising manufacturing a chip card sheet according to one of items 17 to 21, providing at least one first chip module opening in the second plastic cover layer sheet and in the first plastic top layer sheet.

24. Method of manufacturing a chip card sheet according to item 23, comprising providing a second chip module opening in the first compensation layer sheet and in the second overlay layer sheet.

25. Method of manufacturing a chip card, comprising:

providing a chip card sheet according to one of items 23 or 24, placing a dual-interface chip module into the first chip module opening and/or into the second chip module opening, the dual-interface chip module comprising a chip module antenna 110, a chip module PCB with ISO contact pads, a dual-interface chip and a plastic chip cover material, cutting out a chip card from that area of the chip card sheet that comprises the dual-interface chip module.

26. Method of manufacturing a chip card, comprising:

providing a chip card sheet according to item 21 or item 22, cutting out a chip card area from the chip card sheet, providing a first chip module opening in the second plastic cover layer and in the first plastic top layer.

27. Method of manufacturing a chip card according to item 26, comprising:

providing a second chip module opening in the first compensation layer and in the second overlay layer 28. Method of manufacturing a chip card according to item 26 or item 27, comprising:

placing a dual-interface chip module into the first chip module opening and/or into the second chip module opening, the dual-interface chip module comprising a chip module antenna 110, a chip module PCB with ISO contact pads, a dual-interface chip and a plastic chip cover material.

29. Use of an upper lamination plate and a lower lamination plate for carrying out a lamination step according to one of items 17 or 18.

30. Item according to the aforementioned items, wherein there is provided an oscillating effect by designing the LED panel into an oscillator circuit, using the inductance of the first antenna coil or another inductance, the rectifying capacitor or another capacitance, and optionally a switching element such as a transistor.

Reference is made to the earlier patent applications U.S. 63/568,973 of 22 Mar. 2024 and U.S. Ser. No. 19/087,189 of 21 Mar. 2025 the contents of which are herein incorporated by reference. Protection may be sought for combinations of features which are disclosed in these reference documents. It is disclosed there how these features combinations contribute to achieving the technical aim of the present application and they are thus comprised in the solution of the technical problem underlying the subject matter of the present application. The features and combinations which are disclosed in the reference documents implicitly belong to the description of the subject matter in the present application and thus to the content of the present application as filed.

| REFERENCE NUMERAL LIST | |
| --- | --- |
| 10 | first antenna coil |
| 11 | contactless chip module |
| 12 | second antenna coil |
| 13 | third end section |
| 14 | fourth end section |
| 15 | first end section |
| 16 | second end section |
| 17 | antenna pad |
| 17 | antenna pads |
| 20 | OLED module |
| 21 | OLED panel |
| 22 | ICT element |
| 23 | first connection pad |
| 24 | second connection pad |
| 25 | first connection element |
| 26 | second connection element |
| 27 | rectifier assembly |
| 30 | capacitor module |
| 40 | third antenna coil |
| 50 | second overlay layer |

-continued

REFERENCE NUMERAL LIST

| | |
|---|---|
| 51 | first overlay layer |
| 52 | second compensation layer |
| 53 | first compensation layer |
| 54 | antenna layer |
| 55 | second plastic cover layer |
| 56 | second transparent plastic top layer |
| 57 | first plastic cover layer |
| 58 | first plastic cover top layer |
| 58 | first transparent plastic top layer |
| 60 | inlay element |
| 65 | bottom surface |
| 66 | top surface |
| 70 | upper lamination plate |
| 71 | lower lamination plate |
| 100 | Smart card |
| 111 | chip module PCB |
| 112 | first chip module opening |
| 113 | second chip module opening |
| 114 | plastic chip cover material |
| 115 | dual-interface chip |
| 132 | insulating substrate |

Other reference numbers and terms used are:

10 1st antenna coil
11 COB/ contactless chip module
12 2nd antenna coil
13 end section
14 first end section of second antenna coil
15 second end section of second antenna coil
16 end section
17 antenna pad
20 OLED module
21 OLED panel
32 flexible capacitor PCB
33 first metal pad
34 second metal pad
35 first contact
36 second contact
37 first connective material
38 second connective material
39 plastic cover material
40 3rd antenna coil
41 section
42 section
50 2nd overlay layer
51 1st overlay layer
52 2nd compensation layer
53 1st compensation layer
54 antenna layer
55 second plastic (PVC) cover layer
57 first plastic (PVC) cover layer
56 second transparent plastic (PVC) top layer
58 first transparent plastic (PVC) top layer
60 inlay element
65 bottom surface
66 top surface
70 upper lamination plate
71 lower lamination plate
100 smart card
101 coordinate system
110 chip module antenna
111 chip module PCB [with ISO contact pads]

22 ICT (InterConnecT) element
23 1st connection pad
24 2nd connection pad
25 first connection element (to anode of OLED panel)
26 second connection element (to cathode of OLED panel)
27 rectifier assembly
30 [COB] capacitor module
31 tuning capacitor C1
112 first chip module opening
113 second chip module opening
114 plastic chip cover material
115 dual-interface chip
120 first ICT via
121 second ICT via
122 third ICT via
123 fourth ICT via
124 first bridge trace
125 second bridge trace
126 anode connector base trace
127 cathode connector base trace
130 first rectifier Diode D2 contact
131 second rectifier Diode D2 contact
132 ICT plastic substrate
133 anode connector comb traces
134 cathode connector comb traces
135 electrically conductive material
136 protective plastic cover material
D1 rectifier diode D1
D2 rectifier Diode D2
D3 rectifier Diode D3
D4 rectifier Diode D4
R1 resistor zero/0 ohms
C2 smoothing capacitor C2
A, B distances
C area The following is an overview of the elements of the application, in a consolidated format, organizing the elements by functional groups or categories. This is meant by example, other groupings are possible.

Smart Card Components
　Smart card (10, Intelligent payment card)
Antenna System
　First antenna coil (Primary antenna loop, 10/1st antenna coil)
　Second antenna coil (Auxiliary antenna loop, 12/2nd antenna coil)
　Third antenna coil (Supplementary antenna loop, 40/3rd antenna coil)
　Antenna pad (Connection point for antenna, 17)
Chip Module and Integrated Circuit
　[COB] Contactless chip module (11)
　Dual-interface chip (115)
　Chip module PCB [with ISO contact pads] (111)
　Chip module antenna (110)
OLED and Capacitor Modules
　OLED module (Active OLED component, 20)
　OLED panel (Display panel utilizing OLED technology, 21)
　[COB] Capacitor module (30)
　Tuning capacitor C1 (31)
　Smoothing capacitor C2 (C2)
　Flexible capacitor PCB (32)
Connection and Rectification
　First connection pad (Leading connection point, 23/1st connection pad)
　Second connection pad (Trailing connection point, 24/2nd connection pad)
　First connection element (to anode of OLED panel, 25)
　Second connection element (to cathode of OLED panel, 26)
　Rectifier assembly (Diode bridge circuit, 27)
　Rectifier diodes D1-D4 (D1, D2, D3, D4)
Structure and Lamination Components
　Overlay layers (First overlay layer [51/1st overlay layer], Second overlay layer [50/2nd overlay layer])
　Compensation layers (First compensation layer [53/1st compensation layer],
　Second compensation layer [52/2nd compensation layer])
　Antenna layer (54)
　Plastic (PVC) cover layers (First plastic cover layer [57/first plastic cover layer], Second plastic cover layer [55])
　Transparent plastic (PVC) top layers (First transparent plastic top layer [58], Second transparent plastic top layer [56])
　Inlay element (60)
　Upper and lower lamination plates (70 upper, 71 lower)
　Bottom and top surfaces (65 bottom surface, 66 top surface)
Connectivity and Insulation
　ICT (InterConnecT) element (22)
　ICT plastic substrate (132)
　Electrically conductive material (135)
　Protective plastic cover material (136)
Miscellaneous Components
　Resistor zero/0 ohms (R1)
　Distances (A, B)
　Area (C)
　Openings for chip module (First chip module opening [112], Second chip module opening [113])
　Plastic chip cover material (114)

The invention claimed is:

1. Inlay element for a smart card, comprising:

an antenna layer;

a first antenna coil being arranged on a top surface of the antenna layer;

a second antenna coil being arranged on the top surface of the antenna layer;

a first compensation layer being arranged on the top surface of the antenna layer;

an OLED module being arranged at least partially within the antenna layer and within the first compensation layer;

a first overlay layer being arranged below a bottom surface of the antenna layer; and a transmissive second overlay layer being arranged above a top surface of the first compensation layer;

wherein the first antenna coil is galvanically decoupled from the second antenna coil, and wherein the first antenna coil and the OLED module are connected in series with a rectifier assembly.

2. Inlay element according to claim 1, wherein a second compensation layer being arranged between the first compensation layer and the second overlay layer.

3. Inlay element according to claim 1, further comprising a third antenna coil being galvanically coupled with the second antenna coil, the third antenna coil being arranged on the top surface of the antenna layer.

4. Inlay element according to claim 3, further comprising a capacitor module being arranged at least partially within the antenna layer and within the first compensation layer, contact pads of the capacitor module being connected with end sections of the second antenna coil.

5. Inlay element according to claim 4, wherein the end sections of the second antenna coil are connected with antenna pads of a contactless chip module arranged at least partially within the antenna layer and within the first compensation layer.

6. Inlay element according to claim 1, further comprising a contactless chip module being arranged at least partially within the antenna layer and within the first compensation layer.

7. Inlay element according to claim 1, further comprising an InterConnect (ICT) element for connecting the first antenna coil with an OLED panel of the OLED module, the ICT element further comprising the rectifier assembly.

8. Inlay element according to claim 7, wherein the ICT element comprises a first connection element and a second connection element for contacting the OLED panel.

9. Inlay element according to claim 1, wherein the OLED module is arranged within an enclosed area (C) of the first antenna coil, the area (C) having specified distances (A, B) to edges of the inlay element.

10. InterConnect (ICT) element for electrically connecting a first end section of a first wire and a second end section of a second wire with an anode and with a cathode of an OLED panel, comprising an insulating substrate, a first connection pad for receiving the first end section of the first wire and a second connection pad for receiving the second end section of the second wire, the first connection pad and the second connection pad being provided on a top surface of the insulating substrate, a first connection element for connecting to the anode of the OLED panel and a second connection element for connecting to the cathode of the OLED panel, the first connection element and the second connection element being provided on an upper surface of the insulating substrate, a rectifier assembly, being electrically connected between the first connection pad, the second connection pad, the first connection element and the second connection element, for connecting to the cathode of the OLED panel, wherein the rectifier assembly comprising conductive traces both on the upper surface and on a lower surface of the insulating substrate.

11. ICT element according to claim 10, wherein the rectifier assembly comprises a smoothing capacitor C2 that connects the first connection pad and the second connection pad.

12. ICT element according to claim 10, wherein the rectifier assembly comprises conductive traces and landing pads for taking up a conductive element R1 and for a rectifier diode D1, the conductive element R1 and the rectifier diode D1 electrically connecting the first connection pad, the second connection pad, the first connection element and the second connection element.

13. ICT element according to claim 10, wherein the rectifier assembly comprises conductive traces and landing pads for taking up a rectifier diode D1, a rectifier diode D2, a rectifier Diode D3, and a rectifier Diode D4, the rectifier diode D1, the rectifier diode D2, the rectifier Diode D3, and the rectifier Diode D4 forming a bridge rectifier for electrically connecting the first connection pad, the second connection pad, the first connection element and the second connection element.

14. Method of manufacturing an inlay elements sheet for making smart cards, comprising the steps:

providing an antenna layer plastic sheet with a plurality of antenna layers and with a plurality of cut-out sections for receiving OLED modules, COB contactless chip modules and/or COB capacitor modules, applying an adhesive tape layer at a bottom surface of the antenna layer plastic sheet, at least partly covering the plurality of cut-out sections, providing the OLED modules, the COB contactless chip modules and/or the COB capacitor modules in the cut-out sections in the antenna layer plastic sheet, providing a plurality of first antenna coils on the antenna layer plastic sheet; and connecting the COB contactless chip modules and/or the COB capacitor modules with the respective first antenna coils, providing a plurality of second antenna coils on the antenna layer plastic sheet, and connecting the OLED modules with the respective second antenna coils, providing a first compensation layer plastic sheet with a plurality of cutout sections for the OLED modules, for the COB contactless chip modules and/or for the COB capacitor modules and arranging the first compensation layer plastic sheet on a top surface of the antenna layer plastic sheet, such that the OLED modules, the COB contactless chip modules and/or the COB capacitor modules fit into the respective cut-out sections in the first compensation layer plastic sheet, providing a first overlay layer plastic sheet on the bottom surface of the antenna layer plastic sheet, providing a second overlay layer plastic sheet on a top surface of the first compensation layer plastic sheet, and collating and laminating of the antenna layer plastic sheet, the first compensation layer plastic sheet, the first overlay layer plastic sheet, and the second overlay layer plastic sheet while applying heat and/or pressure.

15. Method of manufacturing a chip card sheet for making smart cards, comprising the steps:
  providing the inlay elements sheet manufactured by the method according to claim 14, and
  providing a transmittent second plastic top layer sheet on a top surface of a second plastic cover layer sheet.

16. Method of manufacturing a chip card sheet, comprising
  manufacturing a chip card sheet according to the method according to claim 15, and
  providing a first plastic top layer sheet on a bottom surface of a first plastic cover layer sheet.

17. Method of manufacturing a chip card, comprising:
  providing a chip card sheet according to claim 16,
  cutting out a chip card area from the chip card sheet, and
  providing a first chip module opening in the second plastic cover layer sheet and in the first plastic cover layer sheet.

18. Method of manufacturing a chip card sheet, comprising manufacturing a chip card sheet according to the method according to claim 15, and
providing at least one first chip module opening in the second plastic cover layer sheet and in the first plastic cover layer sheet.

19. Method of manufacturing a chip card sheet according to claim 18, comprising
  providing a second chip module opening in the first compensation layer sheet and in the second overlay layer sheet.

20. Method of manufacturing a chip card, comprising:
  providing a chip card sheet according to claim 19,
  placing a dual-interface chip module into the first chip module opening and/or into the second chip module opening, the dual-interface chip module comprising a chip module antenna, a chip module PCB with ISO contact pads, a dual-interface chip and a plastic chip cover material, and
  cutting out a chip card from that area of the chip card sheet that comprises the dual-interface chip module.

* * * * *